(12) United States Patent
Nagao

(10) Patent No.: US 7,154,807 B2
(45) Date of Patent: Dec. 26, 2006

(54) SEMICONDUCTOR MEMORY STORAGE DEVICE AND ITS CONTROL METHOD

(75) Inventor: Mitsuhiro Nagao, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/064,054

(22) Filed: Feb. 22, 2005

(65) Prior Publication Data
US 2006/0056249 A1 Mar. 16, 2006

Related U.S. Application Data

(63) Continuation of application No. PCT/JP04/02027, filed on Feb. 20, 2004.

(51) Int. Cl.
*G11C 8/00* (2006.01)
(52) U.S. Cl. ............... 365/230.04; 365/230.03
(58) Field of Classification Search ............ 365/230.03
See application file for complete search history.

(56) References Cited

U.S. PATENT DOCUMENTS

| | | | |
|---|---|---|---|
| 4,330,864 A * | 5/1982 | Ohyabu ................ 376/133 |
| 5,768,560 A * | 6/1998 | Lieberman et al. ......... 711/167 |
| 5,881,009 A | 3/1999 | Tomita |
| 5,905,681 A | 5/1999 | Matsui |
| 6,064,625 A | 5/2000 | Tomita |
| 6,335,901 B1 * | 1/2002 | Morita et al. ............... 365/233 |
| 6,460,110 B1 | 10/2002 | Tomita |
| 6,542,422 B1 | 4/2003 | Furutani et al. |
| 2001/0026478 A1 | 10/2001 | Noda et al. |
| 2001/0042161 A1 | 11/2001 | Tomita |
| 2002/0093870 A1 | 7/2002 | Noda et al. |
| 2002/0194420 A1 | 12/2002 | Tomita |
| 2004/0004866 A1 | 1/2004 | Hidaka |

FOREIGN PATENT DOCUMENTS

| | | |
|---|---|---|
| JP | 06-060691 | 3/1994 |
| JP | 10-340579 | 12/1998 |

* cited by examiner

*Primary Examiner*—Thong Q. Le
(74) *Attorney, Agent, or Firm*—Ingrassia Fisher & Lorenz, P.C.

(57) ABSTRACT

A redundancy judge circuit (3) includes a redundancy judge circuit address+1 controller (30), an even-numbered redundant address judge section (31), an odd-numbered redundancy judge section (32), a redundant address ROM (33), a redundant IOROM (34), and a select section (35). The redundancy judge circuit (3) may also include a memory cell circuit (2), a read circuit (4), and an address generator circuit (5). With this structure, redundancy remedy can be conducted even during the burst operation due to the 2-bit prefetch, and slowing of the read operation speed can be prevented. Because it is possible to reduce the signal bus length of a decode signal bus in a column direction to substantially half and to reduce a decode signal bus region to substantially half, it is possible to prevent the wiring density in the wiring region of the decode signal bus from becoming high thereby preventing an increase in the read speed.

11 Claims, 9 Drawing Sheets

SEMICONDUCTOR MEMORY STORAGE DEVICE AND ITS CONTROL METHOD

CROSS-REFERENCES TO RELATED APPLICATIONS

This is a continuation of International Application No. PCT/JP2004/002027, filed Feb. 20, 2004 which was not published in English under PCT Article 21(2).

FIELD OF THE INVENTION

The present invention relates to data readout of a semiconductor memory device, and more particularly to a semiconductor memory device having a circuit structure with a redundancy circuit which enables burst read operation and a method of controlling the semiconductor memory device.

BACKGROUND OF THE INVENTION

One of the operation modes that are capable of consecutively performing high-speed reading operation in a semiconductor memory device is a burst mode. A burst mode is a mode that outputs memory data at addresses consecutive from an address input from external to the memory device as an origin. The number of consecutive output bits has 2 bits, 4 bits, 8 bits or the like designated. In the burst mode, there is a method in which addresses consecutive to an external address are internally generated on the basis of the external address, and the generated addresses are decoded to output memory data. In this method, an internal memory cell array is divided into a memory cell array at an odd-numbered address side and a memory array at an even-numbered address side. In the burst mode, addresses from which the lowest-order bit is eliminated are supplied to column decoders of the odd-numbered address side memory cell array and the even-numbered address side memory cell array with respect to the address given from the external or the addresses internally generated. The application of the above circuit structure makes it possible to consecutively always read out the memory data of 2 bits. This is called a "2-bit prefetch circuit" which is capable of performing high-speed burst read.

FIG. 8 shows an example of a 2-bit prefetch circuit of a conventional SDRAM 900 in Patent document 1 (Patent Document 1: JP 10-340579A (paragraphs 0006 to 0010, and FIG. 13)). In this example, the memory cell array is divided into an odd-numbered address memory cell array 910 and an even-numbered address memory cell array 920. Then, address predecoders 911, 921 and address main decoders 912, 922 are provided in the respective memory cell arrays 910 and 920. In addition, the outputs of the respective memory cell arrays 910 and 920 are amplified by data bus amplifiers 913 and 923.

The SDRAM 900 operates in synchronism with a clock 901 supplied from a system side. Accordingly, a command signal 902 is latched in a command latch decoder 932, and an address signal 903 (10 bits of a0 to a9 in this example) is latched in an address buffer 933 at a timing of a clock 931 outputted from a clock buffer 930 that takes in the clock 901. Then, the address signals a3 to a9 from the address buffer 933 are latched in an address latch 938 at a timing of an address latch clock 935 that is generated by the command latch decoder 932. Also, the address signals a1 and a2 are latched in an address latch counter 939 according to the same clock 935.

The address signals a3 to a9 are supplied to the odd- and even-numbered address predecoders 911 and 921 as they are. On the other hand, the addresses a1 and a2 are supplied to the odd-numbered address predecoder 911 as they are. Also, a latch address 944 of the addresses a1 and a2 or a new shift address 948 whose address value increases by 1 through an address+1 arithmetic circuit 946 is supplied to the even-numbered address predecoder 921 according to a value of a lowest-order address a0, that is, according to an odd number or an even number. The reason why the shift address 948 is necessary is that since the memory data at a given column address and memory data at a column address subsequent to the given address are consecutively outputted, it is necessary to generate the subsequent address with respect to the given column address.

In other words, the shift address 948 that has been subjected to address+1 processing by the address+1 arithmetic circuit 946 is generated with respect to the given column address, and the column address (a2, a1) that is supplied to the even-numbered-side decoder changes in response to the lowest-order bit a0 of the given address being 0 (even-numbered address) and 1 (odd-numbered address). Similarly, the order of latching the outputs of the data bus amplifiers 913 and 923 to output data latch circuits 916 and 926 changes in response to the lowest-order bit a0 being 0 or 1.

When it is assumed that the given address is (a2, a1, a0)=(0, 0, 0), a first address becomes (0, 0, 0), and a second address becomes (0,1,0). In this situation, because the lowest-order address a0 is "0", data that is initially read is data in the even-numbered memory cell array, and data that is subsequently read is data in the odd-numbered memory cell array. Accordingly, (a2, a1)=(0, 0) needs to be supplied to both of the odd-numbered-side decoder and the even-numbered-side decoder. Similarly, when it is assumed that the given address is (a2, a1, a0)=(0, 0, 1), the first address is (0, 0, 1), and the second address is (0, 1, 0). In this situation, because the lowest-order address a0 is "1", data that is initially read is data in the odd-numbered memory cell array, and data that is subsequently read is data in the even-numbered memory cell array. Accordingly, it is necessary to supply (a2, a1)=(0, 0) to the odd-numbered-side decoder and supply (a2, a1)=(0, 1) that has been subjected to +1 to the even-numbered-side decoder.

The operation of data output will now be described. In the case where the external address is the lowest-order address a0=0 (even-numbered address), the even-numbered memory data 924 that has been outputted from the even-numbered data bus amplifier 923 is latched in the output data latch circuit 916 at a timing of a clock 956. Then, the odd-numbered memory data 914 that has been outputted from the odd-numbered data bus amplifier 913 is latched in the output data latch circuit 926 at a timing of a clock 957. Then, data is consecutively outputted in the order of even and odd from the output data latch circuits 916 and 926.

On the other hand, in the case where the external address is the lowest-order address a0=1 (odd-numbered address), the odd-numbered memory data 914 is latched in the output data latch circuit 916 at a timing of the clock 956, and the even-numbered memory data 924 is latched in the output data latch circuit 926 at a timing of the clock 957, respectively. Then, data is consecutively outputted in the order of even and odd from the output data latch circuits 916 and 926.

However, in Patent Document 1, no operation of the redundancy function is disclosed. Therefore, it is assumed that a circuit is constituted such that a redundancy judge circuit 970 (a circuit having an even-numbered-side judgment section 971 and an odd-numbered-side judgment section 972 which judges an address that needs to be relieved) is added to the circuit shown in FIG. 8, and the latch address 944 that does not pass through the address+1 arithmetic circuit 946 is supplied to the redundancy judge circuit 970 to conduct redundancy comparison.

When the address that is supplied from the external is (a2, a1, a0)=(0, 0, 1), (a2, a1)=(0, 0) is supplied to the odd-numbered address predecoder 911, and (a2, a1)=(0, 1) that has been subjected to address+1 processing is supplied to the even-numbered address predecoder 921, respectively. Then, data is consecutively read from the memory cell array in the order of consecutive column addresses (0, 0, 1) and (0, 1, 0). However, because the column address (a2, a1)=(0, 0) of the latch address 944 that is not subjected to address+1 processing is supplied to both of the odd-numbered-side judgment section 972 and the even-numbered-side judgment section 971 of the redundancy judge circuit 970, the redundancy judgment of data is consecutively conducted in the reverse order of the consecutive column addresses (0, 0, 1) and (0, 0, 0). As a result, there occurs a situation in which there are addresses that do not coincide with each other at the time of decoding the even-numbered address.

Therefore, there occurs a situation in which the addresses that are supplied to the memory cell array 920 and the even-numbered-side judgment section 971 of the redundancy judge circuit 970 do not coincide with each other, and there is a fear that the redundancy comparison of the even bit line is not precisely conducted. This is a problem. That is, in the case where a start address is odd, the even-numbered internal address is subjected to address+1, and a 2-bit prefetch operation is conducted, to thereby incorporate the non-corresponding redundancy judge circuit 970 into a circuit that realizes the same access time as that of the even start at the time of the odd start. In this case, there occurs a situation in which the order of the addresses to be read is reversed, and the redundancy judgment is not precisely conducted when the external address odd-starts, which is also a problem.

In addition, when a circuit is constituted such that the shift address 948 that has passed through the address+1 arithmetic circuit 946 is supplied to the even-numbered judgment section 972 of the redundancy judge circuit 970 at the time of even-starting the external address, it is possible to normally conduct 2-bit prefetch operation. However, the SDRAM 900 normally has a plurality of banks, and the address+1 arithmetic circuit 946 needs to be provided for each of the banks while the redundancy judge circuit 970 is provided commonly to the respective banks.

Accordingly, when the address+1 arithmetic circuits 946 provided in each of the banks are going to be shared by a single redundancy judge circuit 970, it is necessary that the respective shift addresses 948 that are outputted from the plurality of banks are inputted to the redundancy judge circuit. As a result, a circuit for changing over the inputted shift address under control is additionally required, and there is a fear that the circuit size becomes large, which is a problem. Also, there is a fear that the input timing of the shift address that is inputted to the redundancy judge circuit may be off due to a difference in the wiring length from the respective banks, and there is a fear that the circuit size will become large because the circuitry is led around from the respective memory cell circuits to the redundancy judge circuit. This, too, is a problem.

The present invention has been made to eliminate at least one of the above problems with the conventional art. It is desirable to provide a semiconductor memory device and a method of controlling the semiconductor memory device, which are capable of conducting redundancy remedy so as to prevent a fear that the read operation speed becomes low and also capable of reducing the circuit area, even in the semiconductor memory device that conducts the burst read operation due to a 2-bit prefetch operation.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
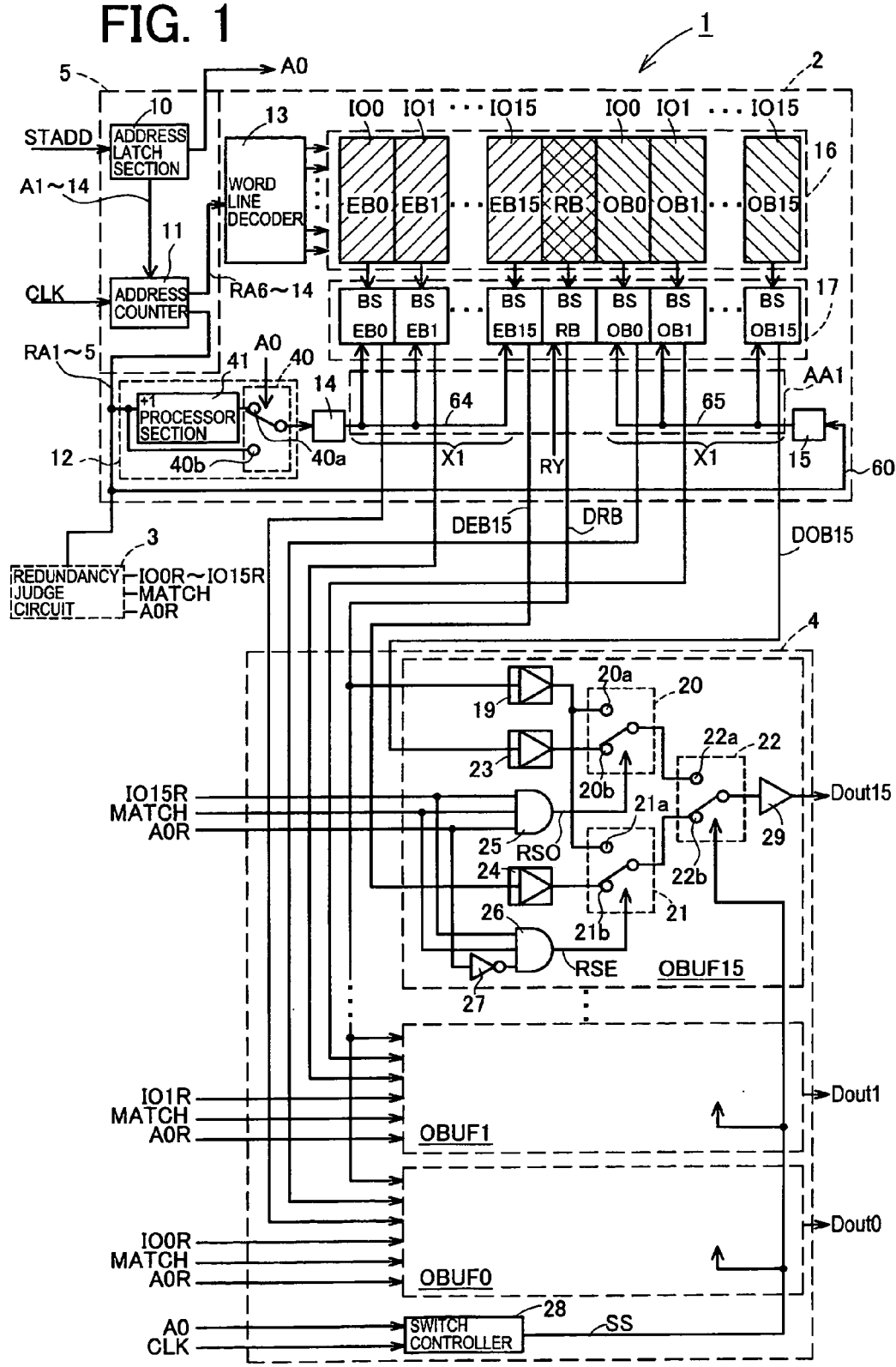
FIG. 1 is a circuit structural diagram showing a semiconductor memory device 1 in accordance with a first embodiment.
Figure 2:
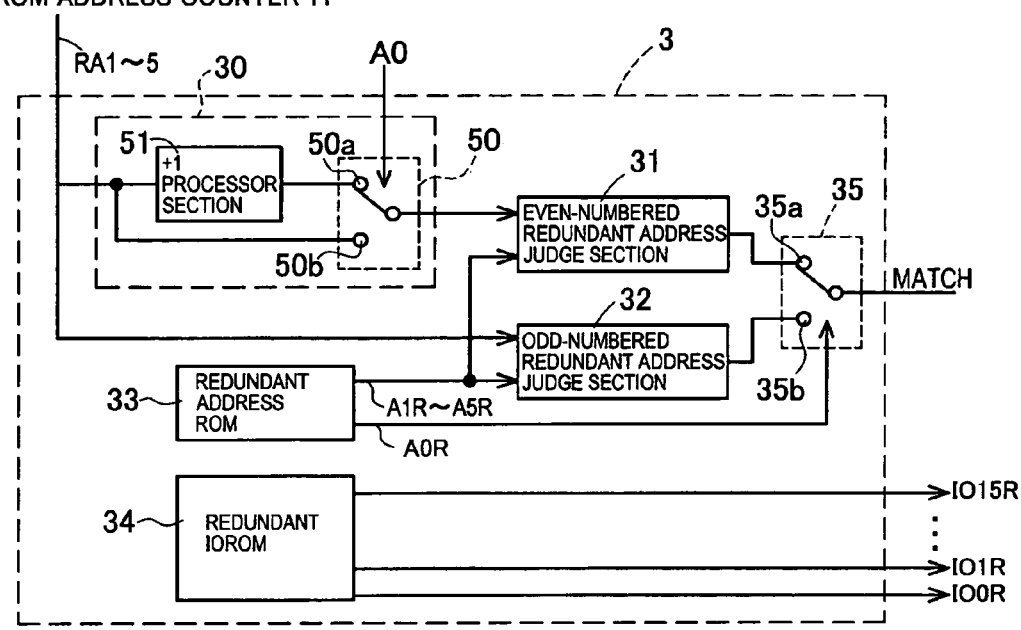
FIG. 2 is a diagram showing a circuit structure of a redundancy judge circuit 3 in accordance with the first embodiment.

Hereinafter, a semiconductor memory device according to embodiments of the present invention will be described in detail with reference to FIGS. 1 to 7. A circuit structural diagram of a semiconductor memory device 1 according to a first embodiment is shown in FIGS. 1 and 2. The semiconductor memory device 1 includes a memory cell circuit 2, a read circuit 4, an address generator circuit 5 and a redundant judge circuit 3 shown in FIG. 1.

The address generator circuit 5 includes an address latch section 10 and an address counter 11. An input terminal of the address latch section 10 is connected to a memory control circuit not shown, and inputted with a start address STADD during burst operation. An output terminal of the address latch section 10 is connected to the address counter 11, a memory cell circuit address+1 controller 12, and a redundancy judge circuit address+1 controller 30 (FIG. 2) which will be described later. Initial addresses A0 to A14 are outputted from the address latch section 10. The initial address A0 that is the lowest-order bit is inputted to the memory cell circuit address+1 controller 12 and the redundancy judge circuit address+1 controller 30, and the initial addresses A1 to A14 are inputted to the address counter 11. A clock signal CLK is inputted to an input terminal of the address counter 11 that increments the start address STADD according to the clock signal CLK to generate read addresses RA1 to RA14. The read addresses RA6 to RA14 are inputted to a word line decoder 13 within the memory cell circuit 2. Also, the read addresses RA1 to RA5 are inputted to the memory cell circuit address+1 controller 12, an odd Y decoder 15, and the redundancy judge circuit address+1 controller 30 and an odd-numbered redundancy judge section 32 which are disposed in the redundancy judge circuit 3 as shown in FIG. 2.

The memory cell circuit 2 includes the memory cell circuit address+1 controller 12, the word line decoder 13, an even Y decoder 14, the odd Y decoder 15, a bank 16, and a bit line selector section 17. The bank 16 has an IO of a 16 bit width having IO0 to IO15, and the respective IOs have even-numbered blocks EB0 to EB15 and odd-numbered blocks OB0 to OB15. Also, the bank 16 has a redundant block RB for redundancy remedy. The even-numbered blocks EB0 to EB15 are disposed in one region in a column direction of the bank 16 (in a direction along which the columns are aligned), and the odd-numbered blocks OB0 to OB15 are disposed in the other region in the column direction, thereby separating the even-numbered block and the odd-numbered block from each other. The redundant block RB is disposed in a border between a region in which the even-numbered blocks are arranged and a region in which the odd-numbered blocks are arranged.

Five hundred and twelve word lines (selected by the lead addresses RA6 to RA14) leading from the word line decoder 13 are arranged through the even-numbered blocks EB0 to EB15, the odd-numbered blocks OB0 to OB15 and the redundant block RB within the bank 16, and are connected commonly to the memory cells of the respective blocks.

The bit line selector section 17 has bit line selectors BSEB0 to BSEB15 corresponding to the even-numbered blocks EB0 to EB15, bit line selectors BSOB0 to BSOB15 corresponding to the odd-numbered blocks OB0 to OB15, and a bit line selector BSRB bit line selector corresponding to the redundant block RB, which are connected to the respective corresponding blocks.

The Y decoder is divided into the even Y decoder 14 and the odd Y decoder 15. The even Y decoder 14 is disposed on the even-numbered block side in the column direction with respect to a border between a region in which the even-numbered blocks EB0 to EB15 are arranged and a region in which the odd-numbered blocks OB0 to OB15 are arranged (on the left side in the column direction with respect to the redundant block RB in FIG. 1). Likewise, the odd Y decoder 15 is disposed on the odd-numbered block side in the column direction with respect to the border (on the right side in the column direction with respect to the redundant block RB in FIG. 1).

An input terminal of the even Y decoder 14 is connected with an output terminal of the memory cell circuit address+1 controller 12, and an input terminal of the odd Y decoder 15 is connected with an output terminal of the address counter 11. An output terminal of the even Y decoder 14 is connected to the bit line selectors BSEB0 to BSEB15 of the bit line selector section 17, and an output terminal of the odd Y decoder 15 is connected to the bit line selectors BSOS0 to BSOB15. The bit line selector BSRB is inputted with a redundant decode signal RY that is outputted from a redundant decoder not shown according to a judgment result obtained by the redundancy judge circuit 3. The output terminals of the respective bit line selectors in the bit line selector section 17 are connected to the respective corresponding output sections OBUF0 to OBUF15.

The read circuit 4 includes output sections OBUF0 to OBUF15. Output data Dout0 to Doutl5 are outputted from the output sections OBUF0 to OBUF15. The output section OBUF15 includes an odd-numbered-side redundant data switch section 20, an even-numbered-side redundant data switch section 21, and a parallel to serial switch section 22. An input terminal of the odd-numbered-side redundant data switch section 20 is connected with a redundant data sense amplifier 19 and an odd-numbered-side data sense amplifier 23, and an input terminal of the even-numbered-side redundant data switch section 21 is connected with the redundant data sense amplifier 19 and an even-numbered-side data sense amplifier 24. The redundant data sense amplifier 19 is connected to the bit line selector BSRB, the odd-numbered-side data sense amplifier 23 is connected to the bit line selector BSOS15, and the even-numbered-side data sense amplifier 24 is connected to an output terminal of the bit line selector BSEB15.

An input terminal of a switch signal of the odd-numbered-side redundant data switch section 20 is connected with an output terminal of an AND gate 25, and an input terminal of a switch signal of the even-numbered-side redundant data switch section 21 is connected with an output terminal of an AND gate 26. The AND gate 26 is inputted with a redundant IO signal IO15R, a coincidence signal MATCH, and a redundant address lowest-order bit A0R that has been inverted through an inverter 27.

An input terminal of a switch controller 28 is inputted with the initial address lowest-order bit A0 and the clock signal CLK, and a switch signal SS is outputted from the switch controller 28. An input terminal of the parallel to serial switch section 22 is connected with the output terminals of the odd-numbered-side redundant data switch section 20 and the even-numbered-side redundant data switch section 21. Also, an input terminal of a switch signal of the parallel to serial switch section 22 is connected with an output terminal of the switch controller 28, and inputted with the switch signal SS. The output data of the parallel to serial switch section 22 is outputted through a buffer 29 as output data Dout 15. The output sections OBUF0 to OBUF14 have the same structure as that of the output section OBUF15.

The circuit structure of the redundancy judge circuit 3 is shown in FIG. 2. The redundancy judge circuit 3 has a redundancy judge circuit address+1 controller 30, an even-numbered redundant address judge section 31, an odd-numbered redundant address judge section 32, a redundant address ROM 33, a redundant IOROM 34, and a select section 35. An input terminal of the even-numbered redundant address judge section 31 is inputted with the read addresses RA1 to RA5 that are outputted from the redundancy judge circuit address+1 controller 30, and the redundant addresses A1R to A5R that are outputted from the redundant address ROM 33. Also, an input terminal of the odd-numbered redundant address judge section 32 is inputted with the read addresses RA1 to RA5 that are outputted from the address counter 11, and the redundant addresses A1R to A5R that are outputted from the redundant address ROM 33.

An input terminal of the select section 35 is connected with output terminals of the even-numbered redundant address judge section 31 and the odd-numbered redundant address judge section 32, and an input terminal of a switch signal of the select section 35 is connected with an output terminal of the redundant address ROM 33. The redundant address A0R of the lowest-order bit is inputted from the redundant address ROM 33. An output terminal of the select section 35 is connected to the AND gates 25 provided in the output sections OBUF0 to OBUF15 of the read circuit 4, respectively, and the coincidence signal MATCH that is outputted from the select section 35 is inputted to the respective AND gates 25. Also, the redundant 10 signals IO0R to IO15R that are outputted from the redundant IOROM34 are inputted to the AND gates 25 provided in the output sections OBUF0 to OBUF15, respectively.

The operation of the semiconductor memory device 1 will now be described. An address for burst operation is generated in the address generator circuit 5. The start address STADD of the burst operation which is outputted from the memory control device not shown, or the like is inputted to the address latch section 10, and then latched as the initial addresses A0 to A14.

The address counter 11 is inputted with the initial addresses A1 to A14 that are outputted from the address latch section 10, and the clock signal CLK, and generates the incremented read addresses RA1 to RA14 according to the click signal CLK. The read addresses RA1 to RA5 are inputted to the even Y decoder 15, and also inputted to the odd Y decoder 14 through the memory cell circuit address+1 controller 12 so as to be used for bit line select decode. On the other hand, the read addresses RA6 to RA14 which are high-order addresses are inputted to the word line decoder 13 and used for word line select decode.

The operation of the memory cell circuit 2 will be described. In the memory cell circuit 2, data is read out of the respective memory blocks of the bank 16 in parallel by the addresses decoded according to the value of the initial address A0 (that is, according to whether the burst read operation starting from the even-numbered address or starting from the odd-numbered address), and the read data is outputted to the read circuit 4.

In the memory cell address+1 controller 12, in the case where the initial address lowest-order bit A0 is "1", after the read addresses RA1 to RA5 that are inputted from the address counter 11 are subjected to address+1 processing, the processed read addresses RA1 to RA5 are outputted to the even Y decoder 14.

For example, when "0" is inputted to the memory cell circuit address+1 controller 12 as the initial address lowest-order bit A0 (at the time of the burst operation even start), the switch 40 is connected to the terminal 40b side, and a address+1 processor section 41 is bypassed. Therefore, the unprocessed read addresses RA1 to RA5 are inputted to the even Y decoder 14 as they are. On the other hand, when "1" is inputted to the memory cell circuit address+1 controller 12 as the initial address lowest-order bit A0 (at the time of the burst operation odd start), the switch 40 is connected to the terminal 40a side, and a path that passes through the +1 processor section 41 is formed. Therefore, the +1 processed read addresses RA1 to RA5 are inputted to the even Y decoder 14.

In the bit line selector BSEB0 to BSEB15, the bit lines of the even-numbered blocks EB0 to EB15 are selected on the basis of a signal that has been decoded by the even Y decoder 14. In the bit line selector BSOB0 to BSOB15, the bit lines of the odd-numbered blocks OB0 to OB15 are selected on the basis of a signal that has been decoded by the odd Y decoder 15. Also, in the bit line selector BSRB, a replacement bit line in the redundant block RB is selected on the basis of the redundant decode signal RY that is outputted from the redundant decoder not shown according to the judgment result from the redundancy judge circuit 3 instead of the signals that are inputted from the even Y decoder 14 and the odd Y decoder 15.

The outputs from the respective selected bit lines of the even-numbered blocks EB0 to EB15, the odd-numbered blocks OB0 to OB15, and the redundant block RB are supplied to the output sections OBUF0 to OBUF15 through the bit line selector section 17.

Figure 9:
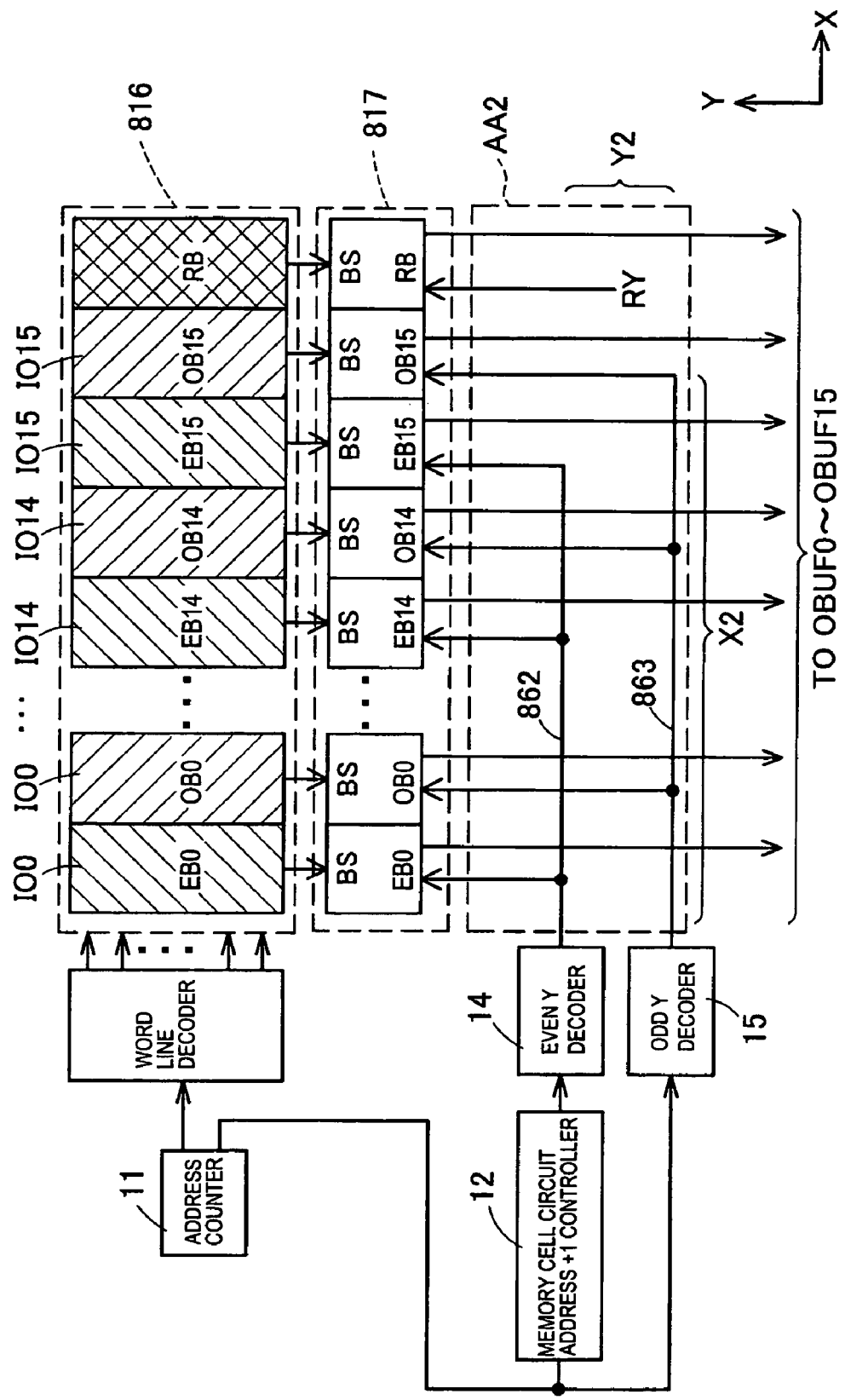
FIG. 9 is a diagram showing the structure of a conventional memory cell circuit.

Now, the circuit structure of the memory cell circuit 2 that is characteristic of the present invention will be described with reference to FIG. 1, and the structure of the conventional memory cell circuit will be described with reference to FIG. 9. A bank 816 in FIG. 9 is structured in such a manner that the even-numbered blocks EB and the odd-numbered blocks OB are alternately arranged, and the redundant block RB is arranged on a right end of the bank 816. Also, the output of the address counter 11 is inputted to the memory cell circuit address+1 controller 12 and the odd Y decoder 15. Other circuits in FIG. 9 have the same structure as that in FIG. 1, and have the same operation and effects. Also, it is assumed that a column direction along which the columns are aligned is an X direction, and a direction of the columns are a Y direction.

In this situation, when a region in proximity to the bit line selector 817 is defined as an output wiring region AA2, and attention is paid to the amount of wiring in the output wiring region AA2, there are disposed two pairs of decode signal buses 862 and 863 whose length in the X direction is X2. The respective decode signal buses are formed by a bundle of 32 signal lines in the case where identification is made by the address signal of 5 bits consisting of the read addresses RA1 to RA5, and two pairs of the decode signal buses are formed by 64 signal lines. Therefore, it is understood that a large wiring area is required.

On the other hand, the bank 16 in the memory cell circuit according to the present invention in FIG. 1 is structured in such a manner that the even-numbered blocks EB0 to EB15 are disposed in a left half region of the bank 16, and the odd-numbered blocks OB0 to OB 15 are disposed in a right half region of the bank 16, separately, and the redundant block RB is disposed between the even-numbered block EB15 and the odd-numbered block OB0. Also, the even Y decoder 14 is disposed on a left side with respect to the bank 16, and the odd Y decoder 15 is disposed on a right side with respect to the bank 16. A location at which the redundant block RB is disposed is not limited.

The output of the address counter 11 is inputted to the even Y decoder 14 through the memory cell circuit address+1 controller 12 while going around the output circuitry region AA1 that exists in proximity to the bit line selector 17 through a bypass address bus 60 and being inputted to the odd Y decoder 15. In this example, when attention is paid to the circuitry in the output wiring region AA1, a pair of decode signal buses 64 and 65 each having a length X1 in the X direction which is about half of a conventional length X2 in the X direction (FIG. 9) are disposed in each of the right and left regions of the bank 16.

The output circuitry regions AA1 and AA2 are highly dense because the input/output wirings of the bit line selector sections 17 and 817 for selecting the large number of memory blocks and the large number of bit lines in the respective blocks, respectively, and reading out data are concentrated in those regions AA1 and AA2. Therefore, it is necessary to reduce the wiring density. Also, in the burst operation that consecutively reads out the data, higher-speed processing is required.

In view of the above, FIGS. 1 and 9 are compared. In FIG. 9, because the odd-numbered blocks and the even-numbered blocks are dispersed without being separated in each of the regions, it is necessary that the decode signal buses 862 and 863 are arranged over the overall bank 816 in the X direction, and a wiring distance X2 is required. On the contrary, because the odd-numbered blocks and the even-numbered blocks are located in the decode signal buses 64 and 65 shown in FIG. 1, the decode signal buses 64 and 65 need to be disposed in the half region of the bank 816 in the X direction. As a result, the wiring distance can be set to X1. Then, because the wiring distance X1 is substantially half of the wiring distance X2, it is possible to set the wiring length of the decode signal bus that is occupied in the output wiring region AA1 to substantially half of the wiring length of the decode signal bus that is occupied in the output wiring region AA2.

Also, in the wiring region in the Y direction in FIG. 9, because the decode signal buses 862 and 863 are overlapped with each other, it is necessary to dispose the wirings such that both of the decode signal buses are not overlapped with each other. Therefore, in the wiring extending from the decode signal bus 863 to the bit line selector 817, it is necessary to elongate the distance in the Y direction by a distance Y2 for preventing the overlap of the wiring with the decode signal bus 862. On the other hand, in FIG. 1, because the wiring region of the decode signal bus 64 and the wiring region of the decode signal bus 65 are not overlapped with each other, it is possible to eliminate the use of the distance Y2 for preventing the overlap.

As a result, with the arrangement of the memory block shown in FIG. 1, the decode signal bus region can be reduced to substantially half, and the wiring length can be reduced to substantially half. Therefore, it is possible to increase the read speed while maintaining the drive performance of the transistors. Also, because the wiring region of the decode signal bus can be reduced to substantially half, it is possible to decrease the drive performance of the transistors in the respective circuits if maintaining the read speed, and it is possible to reduce the areas occupied by the respective circuits of the even Y decoder 14, the odd Y decoder 15 and the bit line selector section 17. Accordingly, the degree of freedom of the design layout is enhanced, and it is possible to avoid circuitry density exceeding the limit such that appropriate routing cannot be arranged.

The operation of the read circuit 4 will be described with reference to the output section OBUF15. After the data DEB15 that has been outputted from the bit line selector BSEB15 of the bit line selector section 17 is inputted to the even-numbered-side data sense amplifier 24 of the output section OBUF15 and then amplified, the data DEB15 is inputted to the even-numbered-side redundant data switch section 21. Also, after the data DOB15 that has been outputted from the bit line selector BSOB15 is inputted to the odd-numbered-side data sense amplifier 23 and then amplified, the data DOB15 is inputted to the odd-numbered-side redundant data switch section 20. Further, after the data DRB that has been outputted from the bit line selector BSRB is inputted to the redundant data sense amplifier 19 and then amplified, the data DRB is inputted to the odd-numbered-side redundant data switch section 20 and the even-numbered-side redundant data switch section 21.

In the odd-numbered-side redundant data switch section 20, as will be described, while a signal of a low level (no redundancy judge) is inputted from the AND gate 25, a terminal 20b is connected, and the data DOB15 that is outputted from the bit line selector BSOB15 is outputted to the parallel-to-serial switch section 22. While a signal of a high level (redundancy judge) is inputted from the AND gate 25, a terminal 20a is connected, and the data DRB that is outputted from the bit line selector BSRS is outputted to the parallel-to-serial switch section 22. Likewise, in the even-numbered-side redundant data switch section 21, while a signal of a low level is inputted from the AND gate 26, the data DEB15 is outputted to the parallel-to-serial switch section 22. Also, while a signal of a high level is inputted, the data DRB is outputted to the parallel-to-serial switch section 22.

As a result, in the case where it is judged that the bit line that has been selected by the odd-numbered block OB15 or the even-numbered block EB15 is a defective bit line, the remedy of the defective bit line can be conducted by replacing the defective bit line by a normal bit line of the redundant block RB.

The initial address lowest-order bit A0 and the clock signal CLK are inputted to the switch controller 28, and the switch signal SS is outputted from the switch controller 28. The switch signal SS is a signal for controlling the parallel-to-serial switch section 22 in such a manner that the connection of the terminal 22a and the terminal 22b of the parallel to serial switch section 22 alternately switches in synchronism with the clock signal CLK.

The parallel-to-serial switch section 22 is inputted with the output data of the odd-numbered-side redundant data switch section 20 and the even-numbered-side redundant data switch section 21 and the switch signal SS. Then, when the initial address lowest-order bit A0 is "1" (odd) which is inputted to the switch controller 28, the connection switch of the parallel to serial switch section 22 starts from the terminal 22a side, and data is outputted in the order of odd and even (data DOB15, data DEB15). As a result, the output data Dout15 that has been subjected to parallel-to-serial conversion can be outputted. On the other hand, when the initial address lowest-order bit A0 is "0" (even) which is inputted to the switch controller 28, the connection switch of the parallel-to-serial switch section 22 starts from the terminal 22b side, and the output data Dout15 that has been subjected to parallel to serial conversion can be outputted in the order of even and odd. The output sections OBUF0 to OBUF14 conduct the same operation as that of the output section OBUF15.

The operation of the redundancy judge circuit 3 will be described. In the redundancy judge circuit 3 shown in FIG. 2, the redundant addresses A1R to A5R which are inputted from the redundant address ROM 33 and the read addresses RA1 to RA5 which are inputted from the address counter 11 are subjected to coincidence judge in the even-numbered redundant address judge section 31 and the odd-numbered redundant address judge section 32. As a result, it is judged whether the bit line that has been read and selected by the even-numbered block and the odd-numbered block of the bank 16 is a defective bit line, or not.

Also, in the select section 35, when the redundant address lowest-order bit A0R is odd, a terminal 35b side is connected, and the output of the odd-numbered redundant address judge section 32 is outputted as the coincidence signal MATCH. When the redundant address lowest-order bit A0R is even, a terminal 35a side is connected, and the output of the even-numbered redundant address judge section 31 is outputted as the coincidence signal MATCH. Also, the redundant addresses A0R to A5R of the defective bit line in which the defective cell exists are stored in the redundant address ROM 33 in advance, and IO that is connected with the memory block within the bank 16 in which the defective bit line exists is stored in the redundant IOROM34 in advance.

When "0" is inputted to the redundancy judge circuit address+1 controller 30 as the initial address lowest-order bit A0, the switch 50 is connected to the terminal 50b side, and the address+1 processor section 51 is bypassed. Therefore, the read addresses RA1 to RA5 are inputted to the even-numbered redundant address judge section 31 as they are. On the other hand, when "1" is inputted to the redundancy judge circuit address+1 controller 30 as the initial address lowest-order bit A0, the switch 50 is connected to the terminal 50a side, and a path that passes through the address+1 processor section 51 is formed. Therefore, the read addresses RA1 to RA5 that have been subjected to address+1 processing are inputted to the even-numbered redundant address judge section 31. The select section 35 connects the terminal 35b and the output terminal when the redundant address lowest-order bit A0R is odd, and connects the terminal 35a and the output terminal when the redundant address lowest-order bit A0R is even.

The operation of the redundancy judge circuit 3 in the case where the burst read operation is the odd start will be described with reference to a case in which the lowest-order bit A0 of the initial address that has been latched by the address latch section 10 (FIG. 1) is "1", and the read addresses that have been generated by the address counter 11 are RA5 to RA1=(00001). In this case, because the initial address lowest-order bit A0 is "1", the burst read operation is the odd start. The switch 50 is connected to the terminal 50a side. Accordingly, the even-numbered redundant address judge section 31 is inputted with the read addresses RA5 to RA1=(00010) that have been subjected to address+1 processing by the address+1 processing section 51. Also, the odd-numbered redundant address judge section 32 is inputted with the unprocessed read addresses RA5 to RA1=(00001) as they are.

Now, a description will be given of a case in which the redundant addresses that have been stored in the redundant address ROM 33 are the redundant addresses A5R to A0R=(000011), and IO in which the defective bit line in the bank 16 which is stored in the redundant IOROM 34 exists is IO15. When the redundant address lowest-order bit A0R is "1", the defective bit line exists in the odd-numbered block, and when the redundant address lowest-order bit A0R is "0", the defective bit line exists in the even-numbered block. The redundant addresses A5R to A1R=(00001) from which the lowest-order bit A0R is eliminated are inputted to the even-numbered redundant address judge section 31 and the odd-numbered redundant address judge section 32 from the redundant address ROM33, and then subjected to coincidence judge with the read address. In the odd-numbered redundant address judge section 32, because all of the read addresses RA5 to RA1 and the redundant addresses A5R to A1R to be inputted coincide with (00001), the high-level signal representative of the coincidence is outputted from the odd-numbered redundant address judge section 32. Also, in the even-numbered redundant address judge section 31, because the read addresses RA5 to RA1=(00010) which are inputted from the redundancy judge circuit address+1 controller 30 do not coincide with the redundant addresses A5R to A1R=(00001), a signal that is outputted from the even-numbered redundant address judge section 31 is maintained at the low level.

Also, the select section 35 is inputted with the odd-numbered redundant address lowest-order bit A0R "1", and selects so as to supply the output of the odd-numbered redundant address judge section 32 to the read circuit 4. Therefore, the output of the odd-numbered redundant address judge section 32 is supplied to the read circuit 4 from the redundancy judge circuit 3 as the coincidence signal MATCH of the high level. Also, the redundant IO signal IO15R of the high level and the redundant IO signals IO0R to IO15R of the low level are outputted from the redundant IOROM34 to the read circuit 4.

On the other hand, a description will be given of a case in which the redundant address that has been stored in the redundant address ROM 33 is the redundant addresses A5R to A0R=(000010). Likewise, in this example, because the redundant addresses A5R to A1R=(00001) from which the lowest-order bit is eliminated coincide with the read addresses RA5 to RA1=(00001) that have been inputted to the odd-numbered redundant address judge section 32, the signal of the high level is outputted from the odd-numbered redundant address judge section 32. Also, because the redundant addresses A5R to A1R=(00001) do not coincide with the read addresses RA5 to RA1=(00010) that have been inputted to the even-numbered redundant address judge section 31, the signal of the low level is outputted from the even-numbered redundant address judge section 31.

The coincidence judge of the read addresses RA5 to RA1 from which the lowest-order bit is eliminated and the read addresses A5R to A1R that have been stored in the redundant address ROM 33 is controlled by the even-numbered redundant address judge section 31 and the odd-numbered redundant address judge section 32. The coincidence judgment result is outputted from the odd-numbered redundant address judge section 32.

In addition, in the select section 35, the coincidence judge of the even and odd blocks is conducted. That is, connection is made in such a manner that the even-numbered redundant address lowest-order bit A0R="0" is inputted to the select section 35, and the output of the even-numbered redundant address judge section 31 is supplied to the read circuit 4. As a result, the signal of the high level which is outputted from the odd-numbered redundant address judge section 32 is not outputted to the read circuit 4, and a redundant operation is not conducted.

With the above structure, the coincidence judge of the read addresses RA5 to RA1 and the redundant addresses A5R to A1R is conducted by the even-numbered redundant address judge section 31 and the odd-numbered redundant address judge section 32. The coincidence judge of the even and odd block from which data is read out and the even and odd block that is designated by the redundant address A0R is controlled by the select section 35.

The redundant switch operation in the output section OBUF15 of the read circuit 4 will be described. The redundant switch operation in the output section OBUF15 means operation when the output of the AND gate 25 or the AND gate 26 is at a high level and the block that reads out the data switches to the redundant block RB is from the normal block (the even-numbered blocks EB0 to EB15, and the odd-numbered blocks OB0 to OB15).

The coincidence signal MATCH is a high level, the redundant IO signal IO15R is a high level, and the redundant address A0R is a high level which are outputted from the redundancy judge circuit 3 are inputted to the AND gate 25 and the AND gate 26 provided in the output section OBUF15 of the read circuit 4. Upon this input, the odd-numbered-side redundant switch signal RSO that is outputted from the AND gate 25 becomes high level, and the even-numbered-side redundant switch signal RSE that is outputted from the AND gate 26 becomes low level because the a low level signal is inputted from the inverter 27. When the odd-numbered-side redundant switch signal RSO of the high level is inputted to the odd-numbered-side redundant data switch section 20, the connection of the output terminal of the odd-numbered-side redundant data switch section 20 switches from the terminal 20b to the terminal 20a, and the output of the redundant data sense amplifier 19 is inputted to the parallel-to-serial switch section 22 instead of the output of the odd-numbered-side data sense amplifier 23. Also, when the even-numbered-side redundant switch signal RSE of the low level is inputted to the even-numbered-side redundant data switch section 21, a state in which the output terminal of the even-numbered-side redundant data switch section 21 is connected to the terminal 21b is maintained. The output of the even-numbered-side data sense amplifier 24 is inputted to the parallel-to-serial switch section 22. Accordingly, the block from which data is read out is switched from the odd-numbered block OB15 (data DOB15) to the redundant block RB (data DRB).

Through the above operation, the redundancy remedy can be performed by replacing a defective bit line that exists in the odd-numbered block OB15 by the bit line of the redundant block RB, which is selected by the redundant addresses A5R to A0R=(000011). Also, the same operation is conducted in the other output sections OBUF0 to OBUF14.

Also, in the case where the defective address (which is stored in the redundant address ROM 33) is the redundant addresses A5R to A0R=(000100), the redundant addresses A5R to A1R=(00010) from which the lowest-order bit is eliminated coincide with the read addresses RA5 to RA1= (00010) that have been inputted to the even-numbered redundant address judge section 31. Also, the even-numbered redundant address lowest-order bit A0R=(0) is inputted to the select section 35, and the even-numbered redundant address judge section 31 is selected. As a result, the high level signal which is outputted from the even-numbered redundant address judge section 31 is outputted from the select section 35 as the coincidence signal MATCH. Accordingly, the coincidence signal MATCH which is a high level, the redundant IO signal IO15R which is a high level, and the redundant address A0R which is a low level are inputted to the AND gate 25 and the AND gate 26 provided in the output section OBUF15, and the odd-numbered-side redundant switch signal RSO of the low level and the even-numbered-side redundant switch signal RSE of the high level are outputted.

When the odd-numbered-side redundant switch signal RSO of the low level is inputted to the odd-numbered-side redundant data switch section 20, a state in which the output terminal of the odd-numbered-side redundant data switch section 20 is connected to the terminal 20b is maintained. The output of the odd-numbered-side data sense amplifier 23 is inputted to the parallel-to-serial switch section 22. Also, when the even-numbered-side redundant switch signal RSE of the high level is inputted to the even-numbered-side redundant data switch section 21, the connection of the output terminal of the even-numbered-side redundant data switch section 21 switches from the terminal 21b to the terminal 21a, and the output of the redundant data sense amplifier 19 is inputted to the parallel-to-serial switch section 22 instead of the output of the even-numbered-side data sense amplifier 24.

With the above structure, the redundancy remedy can be performed by replacing a defective bit line that exists in the even-numbered block EB15 by the bit line of the redundant block RB, which is selected by the redundant addresses A5R to A0R=(000100).

As described above, in the first embodiment, the redundancy judge circuit 3 corresponding to the prefetch operation shown in FIG. 2 is incorporated into the circuits (the memory cell circuit 2, the read circuit 4, and the address generator circuit 5) corresponding to the 2-bit prefetch operation shown in FIG. 1, whereby in the case where the start address is odd, +1 is added to the even-numbered-side internal address, and the 2-bit prefetch operation is conducted. As a result, even in the circuit that realizes the same access time as that of the even start in the odd start, the redundancy judge can be precisely conducted.

a. Also, in the first embodiment, the redundancy judge circuit address+1 controller 30 is disposed in the redundancy judge circuit 3 (FIG. 2), whereby even in the case where the redundancy judge circuit 3 is shared by a plurality of banks, it is not necessary to connect the respective memory cell circuit address+1 controllers 12 disposed in the respective banks to the redundancy judge circuit 3.

With the above structure, because it is unnecessary to provide a circuit for switching a plurality of read addresses that are inputted to the redundancy judge circuit 3 from the respective banks under control, and it is unnecessary to provide the circuitry extending from the respective banks to the redundancy judge circuit 3, circuit size increases are not mandated. Also, the timing of the read address which is inputted to the redundancy judge circuit 3 from the respective banks is off due to the occurrence of a signal delay can be prevented.

A second embodiment will be described with reference to FIGS. 3 and 4. A semiconductor memory device 1a according to the second embodiment is characterized by providing a circuit structure having two redundant blocks that consist of an odd-numbered redundant block ROB and an even-numbered redundant block REB.

The redundant memory blocks of the bank 16a in the memory cell circuit 2a have an even-numbered redundant block REB and an odd-numbered redundant block ROB, which are connected to a bit line selector BSREB and a bit line selector BSROB, respectively. Also, an even-numbered redundant decode signal REY that is outputted from the redundant decoder not shown according to the judgment result from the redundancy judge circuit 3a is inputted to a bit line selector BSREB, and an odd-numbered redundant decode signal ROY is inputted to a bit line selector BSROB.

An even-numbered redundant data sense amplifier 37 disposed in an output section OBUF 15a of a read circuit 4a is inputted with a data DREB that is outputted from the even-numbered redundant block REB, and the data DREB is outputted to the even-numbered-side redundant data switch section 21 after being amplified. Likewise, an odd-numbered redundant data sense amplifier 19 is inputted with a data DROB that is outputted from the odd-numbered redundant block ROB, and the data DROB is outputted to the odd-numbered-side redundant data switch section 20 after being amplified.

Figure 3:
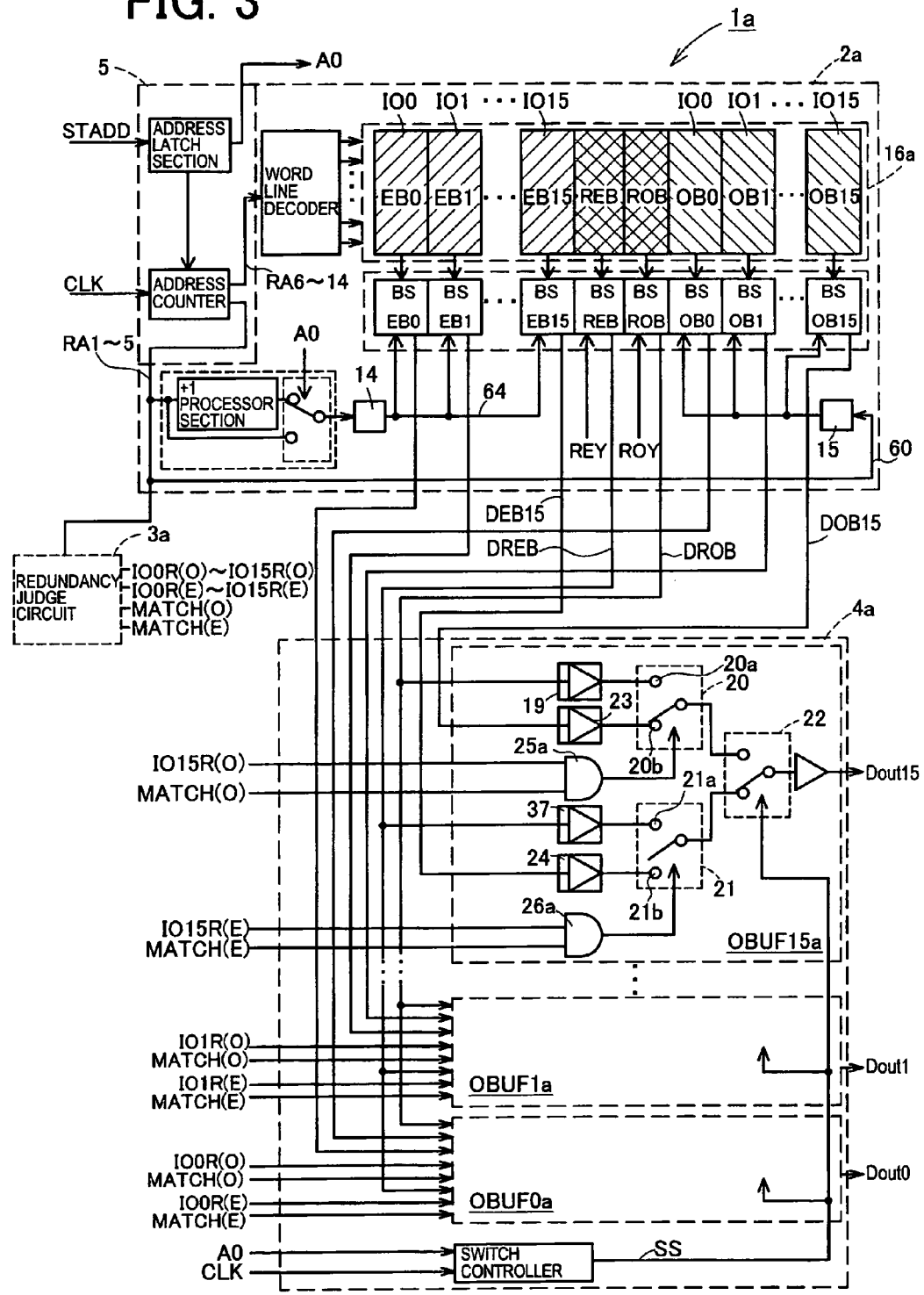
FIG. 3 is a circuit structural diagram showing a semiconductor memory device 1a in accordance with a second embodiment.

Unlike the circuit of FIG. 1, the AND gate 25a in FIG. 3 does not need to be inputted with the redundant address A0R, and is inputted with an odd-numbered redundant IO signal IO15R(O) and an odd-numbered coincidence signal MATCH(O) that have been outputted from the redundancy judge circuit 3a. The AND gate 26a does not need to be inputted with the redundant address A0R, and is inputted with an even-numbered redundant IO signal IO15R(E) and an even-numbered coincidence signal MATCH(E). Output sections OBUF0a to OBUF14a have the same structure as that of the output section OBUF15a.

Figure 4:
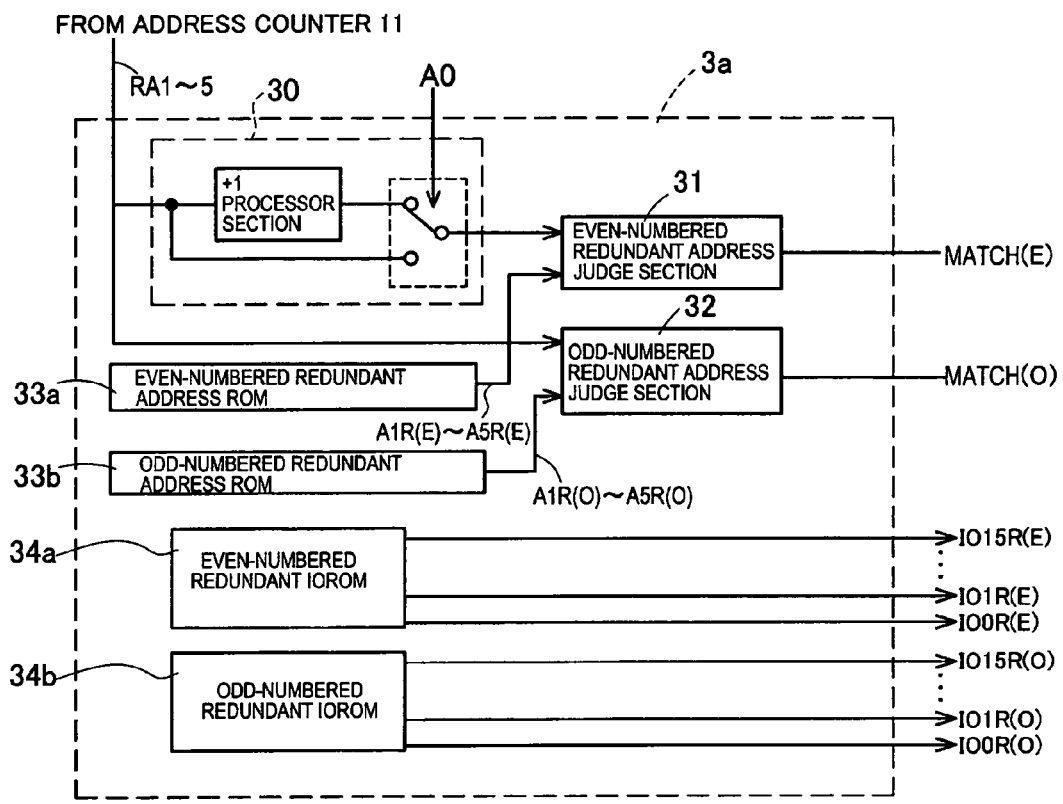
FIG. 4 is a diagram showing a circuit structure of a redundancy judge circuit 3a in accordance with the second embodiment.

The circuit structure of the redundancy judge circuit 3a is shown in FIG. 4. The redundancy judge circuit 3a includes a redundancy judge circuit address+1 controller 30, an even-numbered redundant address judge section 31, an odd-numbered redundant address judge section 32, an even-numbered redundant address ROM 33a, an odd-numbered redundant address ROM 33b, an even-numbered redundant IOROM 34a, and an odd-numbered redundant IOROM 34b. Even-numbered redundant addresses A1R(E) to A5R(E) of the defective bit line in which the defective cell exists in the even-numbered blocks EB0 to EB15 are stored in the even-numbered redundant address ROM 33a in advance. Odd-numbered redundant addresses A1R(O) to A5R(O) of the defective bit line in which the defective cell exists in the odd-numbered blocks OB0 to OB15 are stored in the odd-numbered redundant address ROM 33b in advance.

The even-numbered redundant addresses A1R(E) to A5R (E) that have been outputted from the even-numbered redundant address ROM 33a are inputted to the even-numbered redundant address judge section 31, and the odd-numbered redundant addresses A1R(O) to A5R(O) that have been outputted from the odd-numbered redundant address ROM 33b are inputted to the odd-numbered redundant address judge section 32, respectively. The even-numbered coincidence signal MATCH(E) that has been outputted from the even-numbered redundant address judge section 31 is inputted to the AND gate 26a disposed in the output section OBUF15a of the read circuit 4a, and the odd-numbered coincidence signal MATCH(O) that has been outputted from the odd-numbered redundant address judge section 32 is inputted to the AND gate 25a disposed in the output section OBUF15a.

An IO that identifies a memory block in which a defective bit line exists in the even-numbered blocks EB0 to EB15 is stored in the even-numbered redundant IOROM 34a in advance, and an IO that identifies a memory block in which a defective bit line exists in the odd-numbered blocks OB0 to OB15 is stored in the odd-numbered redundant IOROM 34b in advance.

The even-numbered redundant IO signals IO0R(E) to IO15R(E) that are outputted from the even-numbered redundant IOROM 34a are inputted to the AND gates 26a disposed in the respective output sections OBUF0a to OBUF15a. Also, the odd-numbered redundant IO signals IO0R(O) to IO15R(O) that are outputted from the odd-numbered redundant IOROM 34b are inputted to the AND gates 25a disposed in the respective output sections OBUF0a to OBUF15a. Other circuit structures are identical with those in the first embodiment (FIGS. 1 and 2), and therefore, their description will be omitted.

The redundancy switch operation in the output section OBUF15a will be described. When the coincidence signal MATCH(O) of the high level and the redundant IO signal IO15R(O) of the high level are inputted to the AND gate 25a from the redundancy judge circuit 3a, the output of the AND gate 25a becomes a high level. When the high level output is inputted to the odd-numbered-side redundant data switch section 20, the output terminal of the odd-numbered-side redundant data switch section 20 is connected to the terminal 20a, and the output of the redundant data sense amplifier 19 is inputted to the parallel-to-serial switch section 22 instead of the output of the odd-numbered-side data sense amplifier 23. As a result, the block from which data is read out switches from the odd-numbered block OB15 (data DOB15) to the odd-numbered redundant block ROB (data DROB).

Likewise, when the coincidence signal MATCH(E) of the high level and the redundant IO signal IO15R(E) of the high level are inputted to the AND gate 26a, the block from which data is read out switches from the even-numbered block EB15 (data DEB15) to the even-numbered redundant block REB (data DREB). The same operation is conducted in the other output sections OBUF0a to OBUF14a.

With the above structure, because the redundant blocks REB and ROB, the redundant addresses ROM 33a and 33b, and the redundant IOROM 34a and 34b are provided for even and odd systems, respectively, the redundancy remedy can be performed in each of the even-numbered blocks EB0 to EB15 and the odd-numbered blocks OB0 to OB15, individually. Accordingly, even in the case where a defective bit line exists in each of the even-numbered block and the odd-numbered block, the respective defective bit lines can be remedied. As a result, the number of defect remedies can be improved, the yield of the semiconductor memory device can be improved, and the manufacture costs can be reduced.

A third embodiment will be described with reference to FIG. 5. In the third embodiment, a manner of switching the normal memory block and the redundant memory block is modified. The memory cell circuit 2c includes an even Y decoder 14b, an even-numbered redundant Y decoder 14c, an odd Y decoder 15b, and an odd-numbered redundant Y decoder 15c.

The even-numbered coincidence signal MATCH(E) that has been inputted from a redundancy judge circuit not shown is inputted to the even-numbered redundant Y decoder 14c, and also inputted to the even Y decoder 14b after being inverted by an inverter 70. Likewise, the odd-numbered coincidence signal MATCH(O) is inputted to the odd-numbered redundant Y decoder 15c, and also inputted to the odd Y decoder 15b after being inverted by an inverter 71.

The even-numbered redundant Y decoder 14c and the odd-numbered redundant Y decoder 15c output a decode signal only when the even-numbered coincidence signal MATCH(E) and the odd-numbered coincidence signal MATCH(O) to be inputted are at a high level, and the even Y decoder 14b and the odd-numbered redundant Y decoder 15b output a decode signal only when the even-numbered coincidence signal MATCH(E) and the odd-numbered coincidence signal MATCH(O) to be inputted are at a low level. The outputs of the even Y decoder 14b, the even-numbered redundant Y decoder 14c, the odd-numbered redundant Y decoder 15b and the odd-numbered redundant Y decoder 15c are inputted to the bit line selector BSEB15, the bit line selector BSREB, the bit line selector BSOB15, and the bit line selector BSROB, respectively. The output terminals of the bit line selector BSEB15 and the bit line selector BSREB are commonly connected at a node N1, and then connected to the even-numbered-side data sense amplifier 24 of the output section OBUF15b. The output terminals of the bit line selector BSOB15 and the bit line selector BSROB are commonly connected at a node N2, and then connected to the odd-numbered-side data sense amplifier 23 of the output section OBUF15b. Other circuit structures are identical with that in the second embodiment (FIGS. 3 and 4), and therefore their description will be omitted.

In the redundancy judge circuit not shown, when the even-numbered read address and the redundant address at which a defective bit line exists do not coincide with each other, the even-numbered redundant Y decoder 14c is inputted with a coincidence signal MATCH(E) at a low level, and the even Y decoder 14b is inputted with a coincidence signal MATCH(E) that has been inverted to the high level by means of the inverter 70. In this situation, the decode signal is outputted from the even Y decoder 14b, and the decode signal is not outputted from the even-numbered redundant Y decoder 14c. Therefore, in the bit line selector BSEB15, the bit is selected, and the data DEB15 is outputted. In the bit line selector BSREB, because the bit line is not selected, the data BSREB is not outputted. Accordingly, the data DEB15 is inputted to the even-numbered-side data sense amplifier 24 through the node N1 that is commonly connected.

Also, when the even-numbered read address and the redundant address at which a defective bit line exists coincide with each other, the even-numbered redundant Y decoder 14c is inputted with the coincidence signal MATCH (E) of the high level, and the even Y decoder 14b is inputted with the coincidence signal MATCH(E) that has been inverted to the low level by means of the inverter 70. In this situation, the decode signal is not outputted from the even Y decoder 14b, and the decode signal is outputted from the even-numbered redundant Y decoder 14c. Therefore, in the bit line selector BSEB15, because the bit line is not selected, the data DEB15 is not outputted. In the bit line selector BSREB, the bit line is selected, and the data BSREB is outputted. Accordingly, the data DREB is inputted to the even-numbered-side data sense amplifier 24 through the node N1 that is commonly connected.

Figure 5:
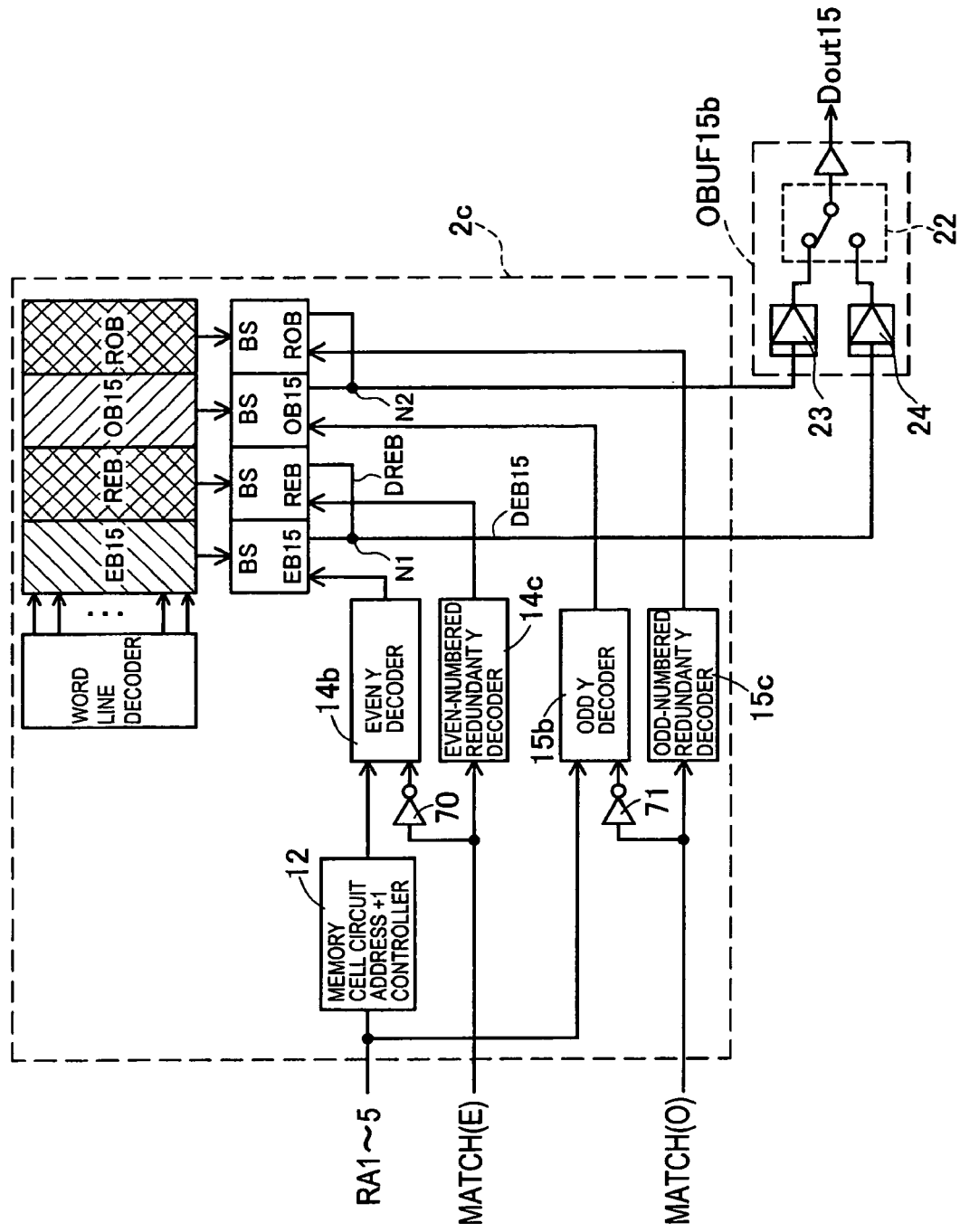
FIG. 5 is a circuit diagram showing a memory cell circuit 2c in accordance with a third embodiment.

That is, with the circuit structure shown in FIG. 5, the data DREB and the data DEB15 can be switched by the bit line selector BSEB15 and the bit line selector BSREB. Therefore, in the output section OBUF15b, it is unnecessary to provide the even-numbered-side redundant data switch section 21 as in the output section OBUF15a of the second embodiment (FIG. 3). Also, it is unnecessary to provide the AND gate 26a that controls the even-numbered-side redundant data switch section 2-1. Also, the data DREB line and the data DEB15 line are commonly connected to allow the even-numbered-side data sense amplifier 24 to be shared. As a result, it is unnecessary to provide the even-numbered redundant data sense amplifier 37 as in the second embodiment (FIG. 3). In addition, since the common connection is made at the node N1, the connection extending from the node N1 to the even-numbered-side data sense amplifier 24 can be shared, thereby making it possible to reduce the number of wirings.

When the circuit structure shown in FIG. 5 is applied to the odd-numbered address side, likewise, it is unnecessary to provide the odd-numbered-side redundant data switch section 20, the redundant data sense amplifier 19, and the AND gate 25a, and it is possible to reduce the number of connections. As a result, the circuit structure of the output section OBUF15b can be simplified, and the number of wirings that are connected to the output section OBUF15b can be reduced. This makes it possible to reduce the chip area and reduce the costs of the semiconductor memory device.

Needless to say, when a plurality of memory cell circuits 2c and a plurality of output sections OBUF15b as shown in FIG. 5 are provided, it is possible to construct the semiconductor memory device having parallel outputs of the output data Dout0 to Dout15 as shown in FIG. 3. Also, FIG. 5 shows an embodiment in which the respective redundant blocks of the even-numbered redundant block REB and the odd-numbered redundant block ROB are divided. However, the present invention is not limited to this structure, and it is clear to one skilled in the art that the present invention can be applied to an embodiment in which the redundant block RB is shared by the odd-numbered block and the even-numbered block as in FIG. 1.

A fourth embodiment will be described with reference to FIG. 6. In the fourth embodiment, the structures and operation of the odd-numbered-side redundant data switch section 20 and the even-numbered-side redundant data switch section 21 are modified in the output section OBUF15 from the first embodiment shown in FIG. 1.

Figure 6:
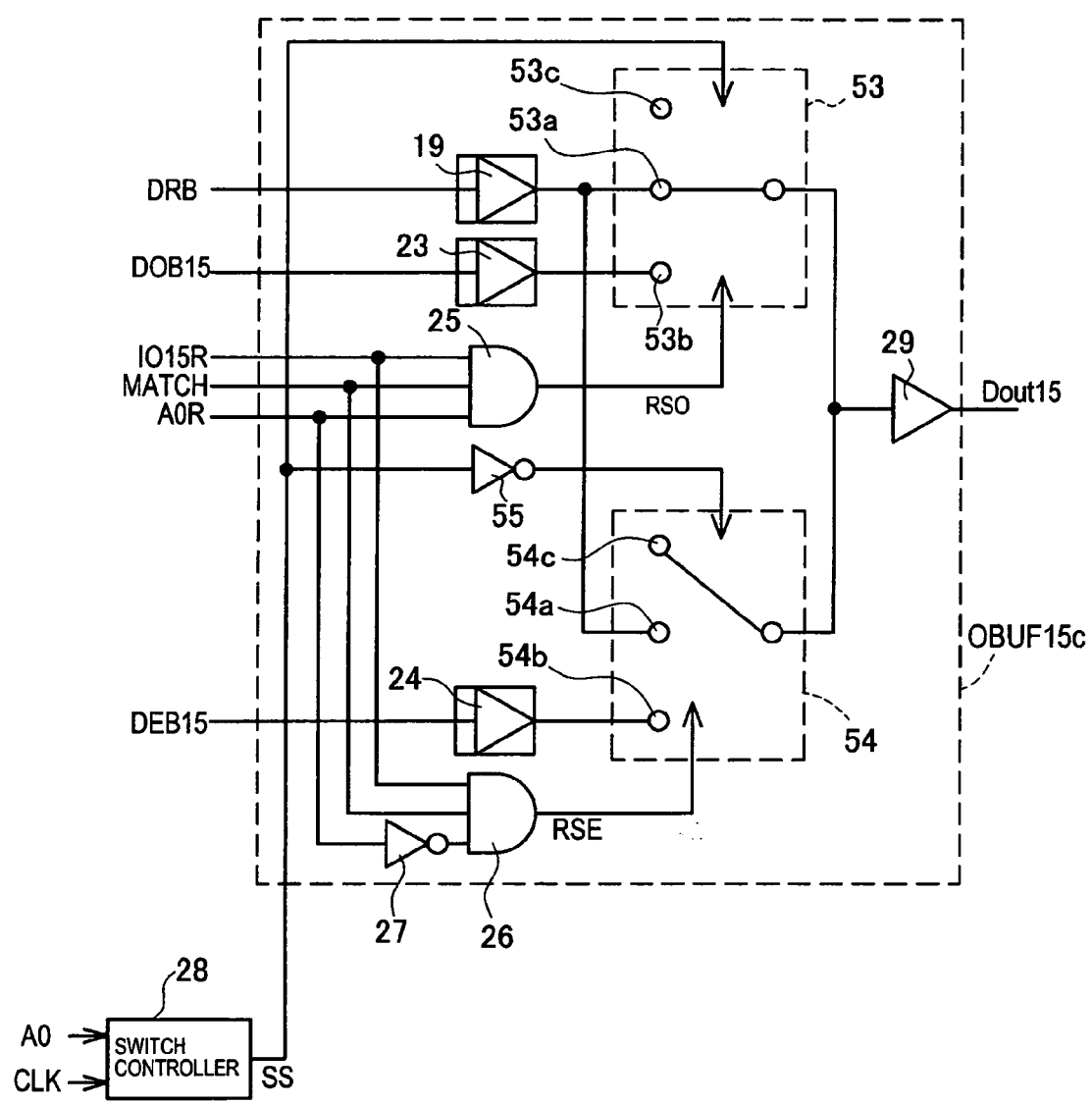
FIG. 6 is a circuit diagram showing an output section OBUF 15c in accordance with a fourth embodiment.

An output section OBUF15c shown in FIG. 6 includes an odd-numbered-side redundant data switch section 53 having three connection terminals 53a to 53c, and an even-numbered-side redundant data switch section 54 having three connection terminals 54a to 54c. The terminal 53a is connected to the redundant data sense amplifier 19, and the terminal 53b is connected to the odd-numbered-side data sense amplifier 23, while the terminal 53c is held in a high impedance state. Likewise, the even-numbered-side redundant data switch section 54 has the three connection terminals 54a to 54c. The terminal 54a is connected to the redundant data sense amplifier 19, the terminal 54b is connected to the even-numbered-side data sense amplifier 24, and the terminal 54c is held in the high impedance state.

The AND gate 25 is inputted with the redundant IO signal IO15R that has been outputted from the redundancy judge circuit 3, the coincidence signal MATCH, and the redundant address lowest-order bit A0R. The odd-numbered-side redundant switch signal RSO that has been outputted from the AND gate 25 is inputted to the odd-numbered-side redundant data switch section 53. The AND gate 26 is inputted with the redundant IO signal IO15R, the coincidence signal MATCH, and the redundant address lowest-order bit A0R that has been inverted through the inverter 27. The even-numbered-side redundant switch signal RSE that has been outputted from the AND gate 26 is inputted to the even-numbered-side redundant data switch section 54.

The switch controller 28 alternately switches and outputs the output data from the odd-numbered-side redundant data switch section 53 and the even-numbered-side redundant data switch section 54 in synchronism with the clock signal CLK, and also outputs the switch signal SS for conducting parallel-to-serial conversion. The switch signal SS is inputted to the odd-numbered-side redundant data switch section 53 and also inputted to the even-numbered-side redundant data switch section 54 after being inverted by an inverter 55.

The operation of the odd-numbered-side redundant data switch section 53 and the even-numbered-side redundant data switch section 54 will be described. The odd-numbered-side redundant data switch section 53 is rendered conductive to the terminal 53c while the inputted switch signal SS is at a high level regardless of the state of the inputted odd-numbered-side redundant switch signal RSO. Also, during a period of time when the inputted switch signal SS is at a low level, the odd-numbered-side redundant data switch section 53 is coupled to the terminal 53b while the odd-numbered-side redundant switch signal RSO at a low level (no redundancy judge) is inputted thereto, and coupled to the terminal 53a while the odd-numbered-side redundant switch signal RSO at a high level (redundancy judge) is inputted thereto, thereby switching the terminal 53a and the terminal 53b. Likewise, the even-numbered-side redundant data switch section 54 is coupled to the terminal 54c while the inputted switch signal SS is at a high level regardless of the state of the inputted even-numbered-side redundant switch signal RSE. Also, during a period of time when the inputted switch signal SS is at a low level, the even-numbered-side redundant data switch section 54 is coupled to the terminal 54b while the even-numbered-side redundant switch signal RSE of the low level is inputted thereto, and coupled to the terminal 54a while the even-numbered-side redundant switch signal RSE at a high level (redundancy judge) is inputted thereto, thereby switching the terminal 54a and the terminal 54b.

During a period of time when the switch signal SS at a low level is outputted from the switch controller 28, the odd-numbered-side redundant data switch section 53 is inputted with the switch signal SS at a low level, and the terminal 53a or the terminal 53b is coupled to the buffer 29. On the other hand, the even-numbered-side redundant data switch section 54 is inputted with an output signal at a high level from the inverter 55, and coupled to the terminal 54c at the high impedance state. Then, the output of the redundant data sense amplifier 19 or the odd-numbered-side data sense amplifier 23 is supplied through the buffer 29 as the output data Dout15.

On the other hand, during a period of time when the switch signal SS at a high level is outputted from the switch controller 28, the even-numbered-side redundant data switch section 54 is inputted with the output signal at a low level from the inverter 55, and the terminal 54a or the terminal 54b are coupled to the buffer 29. Also, the odd-numbered-side redundant data switch section 53 is inputted with the switch signal SS at a high level, and coupled to the terminal 53c at the high impedance state. Then, the output of the redundant data sense amplifier 19 or the even-numbered-side data sense amplifier 24 is supplied through the buffer 29 as the output data Dout15.

Also, when the initial address lowest-order bit A0 that is inputted to the switch controller 28 is "1" (odd), an initial logic level of the switch signal SS becomes low level, and the switch of the outputs of the odd-numbered-side redundant data switch section 53 and the even-numbered-side redundant data switch section 54 starts from the odd-numbered-side redundant data switch section 53 to output the output data Dout15 in the order of the odd-numbered-side and the even-numbered-side. On the other hand, when the initial address lowest-order bit A0 that is inputted to the switch controller 28 is "0" (even), the initial logic level of the switch signal SS becomes high level, and the switch of the outputs of the odd-numbered-side redundant data switch section 53 and the even-numbered-side redundant data switch section 54 starts from the even-numbered-side redundant data switch section 54 to output the output data Dout15 in the order of the even-numbered-side and the odd-numbered-side. As a result, it is possible to output the output data Dout15 that has been subjected to parallel-to-serial conversion according to whether the burst read operation starting at an even-numbered address or an odd-numbered address.

With the above structure, a period of time where the odd-numbered-side redundant data switch section 53 is in the data output state, and the even-numbered-side redundant data switch section 54 is in the high impedance state, and another period of time where the odd-numbered-side redundant data switch section 53 is in the high impedance state, and the even-numbered-side redundant data switch section 54 is in the data output state can be switched in synchronism with the clock signal CLK. As a result, the output data Dout15 that has been subjected to parallel-to-serial conversion can be outputted without requiring a parallel-to-serial switch section 22 as shown in FIG. 1. Therefore, because the parallel-to-serial switch section 22 is not required, it is possible to simplify the circuit of the output section OBUF15c and to reduce the circuit size.

As was described above, according to the semiconductor memory device and the method of controlling the semiconductor memory device in the present invention, in the first embodiment, because the odd-numbered blocks and the even-numbered blocks are located in the bank 16 in one direction and other directions, a wiring region of the decode signal bus 65 that is connected to the odd-numbered memory block region and a wiring region of the decode signal bus 64 that is connected to the even-numbered memory block region can be located at one side and the other side of the column direction with the result that the circuit can be so constituted as not to overlap each other's circuit regions.

Also, because it is possible to reduce the length of the decode signal bus in the column direction to substantially half and to reduce the decode signal bus region to substantially half, the degree of freedom of design in the decode signal bus region can be enhanced. Also, because the length of the decode signal bus can be reduced to substantially half, it is possible to increase the read speed. Further, if maintaining the read speed, it is possible to decrease the drive performance of the transistors in the respective circuits making it possible to reduce the areas occupied by the respective circuits such as the even Y decoder 14 or the odd Y decoder 15. As a result, the degree of freedom of design is enhanced, and it is possible to prevent the circuit density exceeding its limit which could lead to an inability to design in necessary connections.

Also, in the case where the redundant block RB is disposed in a regional border between the odd-numbered memory block region and the even-numbered memory block region, by connecting the decode signal buses 64 and 65 from the odd Y decoder 15 or the even Y decoder 14 to the bit line selector BSRB of the redundant memory block, which is achievable because the redundant block RB exists in the regional border, it is possible to prevent the decode signal buses 64 and 65 from both of the decoders from overlapping each other. Also, in the case where the column in the redundant block RB substitutes for the column in the odd-numbered memory block, or in the case where the column in the redundant block RB substitutes for the column in the even-numbered memory block, the redundant block RB is allowed to exist in the regional border, thereby making it possible to reduce a difference in the data path length to the respective output sections OBUF0 to OBUF15. Accordingly, it is possible to reduce the time required to produce the output data during redundancy remedy. In addition, the location at which the redundant block RB is disposed is not limited.

Also, according to the semiconductor memory device and the method of controlling the semiconductor memory device in the present invention, in the semiconductor memory device having circuits for redundancy remedy such as the redundant block RB, the redundant address ROM 33, the redundant IOROM 34, the odd-numbered redundant address judge section 31, or the odd-numbered redundant address judge section 32, it is possible to read out data from the burst operation.

Further, the coincidence judge of the read addresses RA1 to RA5 and the redundant addresses A1R to A5R is conducted by the even-numbered redundant address judge section 31 and the odd-numbered redundant address judge section 32. The coincidence judge of the even and odd of the block from which data is read out and the even and odd of the block that is designated by the redundant address is conducted by the select section 35. Accordingly, one is added to the high-order column address from which the lowest-order bit is eliminated by the redundancy judge circuit address+1 controller 30, thereby making it possible to conduct the burst operation that enables high-speed read without any time delay with respect to the initial address even in the case where the initial address A0 is "0" (odd).

Still further, in the second embodiment, the redundancy remedy column of the odd-numbered redundant block ROB and the defective column of the odd-numbered blocks OB0 to OB15 are replaced with each other, and the redundancy remedy column of the even-numbered redundant block REB and the defective column of the even-numbered blocks EB0 to EB15 are replaced with each other, to thereby conduct redundancy remedy. As a result, because the redundancy remedy can be conducted in each of the even-numbered blocks and the odd-numbered blocks, the redundancy remedy can be conducted even in the case where the defective column exists in both of the odd-numbered blocks and the even-numbered blocks. Hence, it is possible to enhance the yield ratio of the semiconductor memory device.

Still further, in the third embodiment, because the data DREB and the data DEB15 can be switched by the bit line selector BSEB15 and the bit line selector BSREB, it is unnecessary to provide the even-numbered-side redundancy data switch section 21 (FIG. 3) in the output section OBUF15b, and it is unnecessary to provide the AND gate 26a that controls the even-numbered-side redundant data switch section 21. Also, because the wiring of the data DREB and the data DEB15 are commonly connected, and the even-numbered-side data sense amplifier 24 can be shared, it is unnecessary to provide the even-numbered redundant data sense amplifier 37 (FIG. 3). In addition, the common connection is at the node N1, thereby making it possible to share the wiring extending from the node N1 to the even-numbered-side data sense amplifier 24 and to reduce the number of wirings. With the above structure, because it is possible to simplify the circuit structure of the output section OBUF15b and to reduce the number of wirings that are connected to the output section OBUF15b, it is possible to reduce the chip area and to reduce the costs of the semiconductor memory device.

Still further, in the fourth embodiment, in the odd-numbered-side redundancy data switch section 53 and the even-numbered-side redundant data switch section 54, an odd-numbered-side output step and an even-numbered-side output step are alternately repeated, thereby making it unnecessary to additionally provide the parallel to serial switch section 22 shown in the first embodiment. As a result, it is possible to simplify the circuit structure. In the odd-numbered-side output step, the odd-numbered-side redundancy data switch section 53 selects and outputs any data from the odd-numbered blocks OB0 to OB15 or the redundant block RB, and the output of the even-numbered-side redundant data switch section 54 is in the high impedance state, and in the even-numbered-side output step, the even-numbered-side redundancy data switch section 54 selects and outputs any data from the even-numbered blocks EB0 to EB15 or the redundant block RB, and the output of the odd-numbered-side redundant data switch section 53 is in the high impedance state.

The present invention is not limited to the above embodiments, and can be variously improved and modified within the scope that does not deviate from the subject matter of the present invention.

In the first embodiment, the bank 16 has the redundant block RB with one remedy bit line, but the present invention is not limited to this structure. That is, if a structure is made such that a large number of remedy bit lines are disposed within one bank, and the redundant addresses ROM and the redundant IOROMs corresponding to the number of remedy bit lines are disposed in the redundancy judge circuit, redundancy remedy can be conducted even in the case where a large number of defective bit lines occur within one bank, and the manufacture yield of the semiconductor memory device can be improved.

Figure 7:
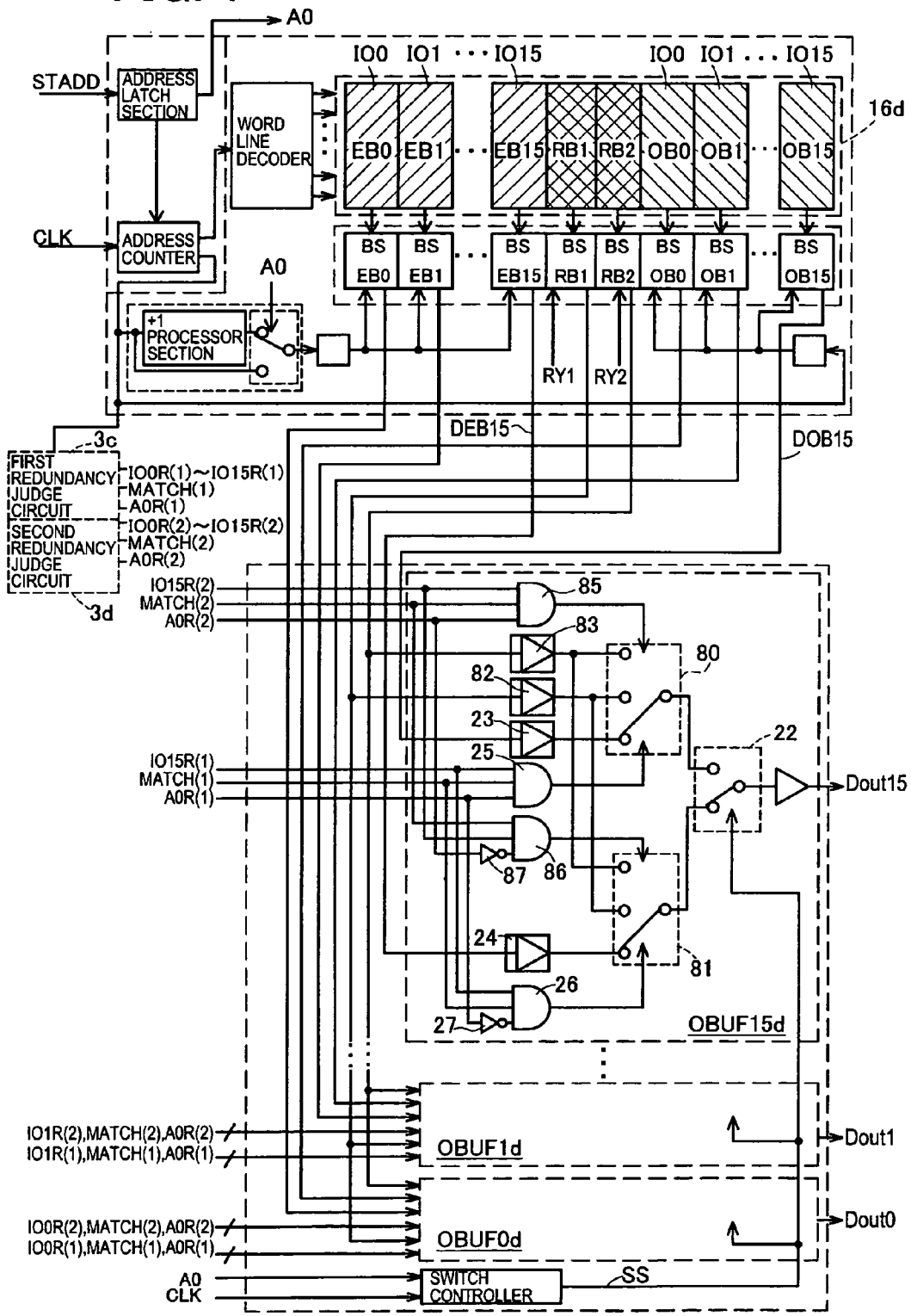
FIG. 7 is a circuit structural diagram showing a modified example of the semiconductor memory device 1.
Figure 8:
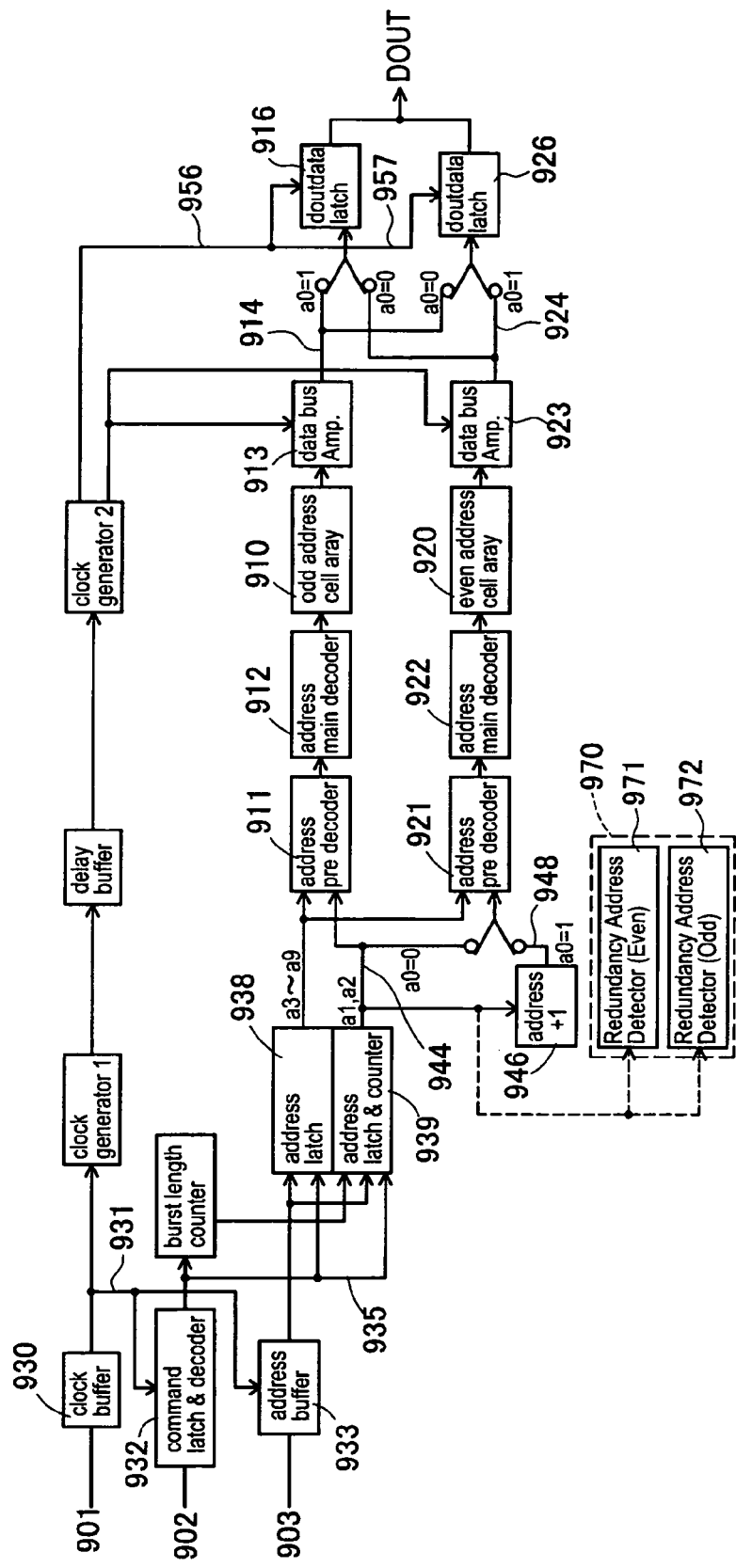
FIG. 8 is a diagram showing an example of a conventional 2 bit prefetch circuit.

For example, as shown in FIG. 7, it is possible that two of the first redundant block RB1 and the second redundant block RB2 are disposed in the bank 16d, and the first redundancy judge circuit 3c and the second redundancy judge circuit 3d are disposed as the redundancy judge circuit. The first redundant block RB1 and the second redundant block RB2 are connected with the bit line selector BSRB1 and the bit line selector BSRB2, respectively. The bit line selector BSRB1 is inputted with the even-numbered redundant decode signal RY1 that is outputted from a redundancy decoder not shown according to the judgment result from the redundancy judge circuit 3c, and the bit line selector BSRB2 is inputted with the odd-numbered redundant decode signal RY2 according to the judgment result from the redundancy judge circuit 3d.

The first redundant IO signals IO0R(1) to IR15R(1), the first coincidence signal MATCH(1), and the first redundant address lowest-order bit A0R(1) are outputted from the first redundancy judge circuit 3c. The second redundant IO signals IO0R(2) to IO15R(2), the second coincidence signal MATCH(2), and the second redundant address lowest-order bit A0R(2) are outputted from the second redundancy judge circuit 3d. Those signals are inputted to the respective corresponding output sections OBUF0d to OBUF15d. The output section OBUF15d includes an odd-numbered-side redundant data switch section 80 that is a selector with three inputs, and an even-numbered-side redundant data switch section 81, and inputs the outputs of the first redundant data sense amplifier 82 and the second redundant data sense amplifier 83, respectively.

The AND gate 25 is inputted with the first redundant IO signal IO15R(1), the first coincidence signal MATCH(1), and the first redundant address lowest-order bit A0R(1) which have been outputted from the first redundancy judge circuit 3c. The AND gate 26 is inputted with the first redundant IO signal IO15R(1), the first coincidence signal MATCH(1), and the first redundant address lowest-order bit A0R(1) that has been inverted through the inverter 27. Likewise, the AND gate 85 is inputted with the second redundant IO signal IO15R(2), the second coincidence signal MATCH(2), and the second redundant address lowest-order bit A0R(2) which have been outputted from the second redundancy judge circuit 3d. The AND gate 86 is inputted with the second redundant IO signal IO15R(2), the second coincidence signal MATCH(2), and the second redundant address lowest-order bit A0R(2) that has been inverted through the inverter 87.

The odd-numbered-side redundant data switch section 80 selects the input of the second redundant data sense amplifier 83 when inputting a signal of the high level from the AND gate 85, selects the input of the first redundant data sense amplifier 82 when inputting a signal of the high level from the AND gate 25, and selects the input of the odd-numbered-side data sense amplifier 23 when inputting signals of the low level from both of the AND gate 85 and the AND gate 25, and outputs those inputs to the parallel to serial switch section 22.

Likewise, the odd-numbered-side redundant data switch section 81 selects the input of the second redundant data sense amplifier 83 when inputting a signal of the high level from the AND gate 86, selects the input of the first redundant data sense amplifier 82 when inputting a signal of the high level from the AND gate 26, and selects the input of the even-numbered-side data sense amplifier 24 when inputting signals of the low level from both of the AND gate 86 and the AND gate 26, and outputs those inputs to the parallel to serial switch section 22.

Other circuit structures are identical with those in the first embodiment (FIGS. 1 and 2), and therefore their description will be omitted. With the above structure, it is possible to remedy two defective bit lines in the bank 16d.

Also, in the fourth embodiment, there is provided the terminal 53c that is in the high impedance state. However, the present invention is not limited to this structure. It is needless to say that the same effect as the structure having the terminal 53c is obtained if both of the terminal 53a and the terminal 53b are not connected. The same is also true for the terminal 54c that is in the high impedance state.

Further, the semiconductor memory device and the method of controlling the semiconductor memory device according to the present invention are not limited to a volatile memory such as an SDRAM, and it is to say that the present invention can also be utilized in a nonvolatile memory such as a flash memory.

The read addresses RA1 to RA5 are an example of the high-column address, the initial addresses A0 to A5 are an example of the initial column address, the redundant addresses A0R to A5R are an example of the defective column address, the redundant blocks A1R to A5R are an example of the high-order defective column address, the odd-numbered block OB0 to OB15 are an example of the odd-numbered memory block region, the even-numbered block EB0 to EB15 are an example of the even-numbered memory block region, the odd Y decoder is an example of the odd-numbered memory block column decoder, the even Y decoder 14 is an example of the even-numbered memory block column decoder, the redundant block RB is an example of the redundant memory block, the memory cell circuit address+1 controller 12 and the redundancy judge circuit address+1 controller 30 are an example of the address+1 circuit, the odd-numbered-side redundant data switch section is an example of the odd-numbered-side switch section, the even-numbered-side redundant data switch section is an example of the even-numbered-side switch section, the buffer 29 is an example of the common output section, the bit line selectors BSOB0 to BSOB15 are an example of the odd-numbered column select section, the bit line selectors BSEB0 to BSEB15 are an example of the even-numbered column select section, and the bit line selectors BSRB, BSREB and BSROB are an example of the redundant column select section.

The connection relationship of the memory cell, the word line and the bit line within the memory block is not limited by the subject matter of the present invention.

To overcome the drawbacks of the prior art, a semiconductor memory device in accordance with the present invention is characterized in that an odd-numbered memory block is selected by an odd-numbered column address; an even-numbered memory block is selected by an even-numbered column address; and the memory cell array, wherein, when data read out from the odd-numbered memory block and from the even-numbered memory block is outputted alternately and continuously to conduct burst operations depending on high-order column addresses obtained by repeating increment of an address which is an inputted initial column address from which the lowest-order bit is eliminated, the even-numbered memory block is selected by a +1 high-order column address which is the high-order column address to which "1" is added in case the initial column address is an odd-numbered address, and the memory cell array comprises an odd-numbered memory block region consisting of the odd-numbered memory block arranged on one side in a column direction for the memory cell array and an even-numbered memory block region consisting of the even-numbered memory block arranged on the other side in a column direction for the memory cell array.

An initial column address is an address that starts the burst operation. The high-order column address is an address obtained by sequentially incrementing an address that eliminates the lowest-order bit from the inputted initial column address. The +1 high-order column address is an address obtained by adding 1 to the high-order column in the case where the initial column address is an odd-numbered address (in the case where the lowest-order bit of the initial column address is "1"). The burst function is a function that outputs memory data at the addresses consecutive from an address given from the external as an origin with respect to the given address. A column direction is a direction along which the columns are aligned. An odd-numbered memory block region is formed by disposing the odd-numbered memory blocks at one side in the column direction of the memory cell array, and an even-numbered memory block region is formed by disposing the even-numbered memory blocks at the other side in the column direction of the memory cell array. That is, the odd-numbered memory blocks and the even-numbered memory blocks are located at one side and the other side of the memory cell array, respectively.

With the above arrangement, a circuit region of plural groups of decode signal buses that are connected to the odd-numbered memory block region and a circuit region of plural groups of decode signal buses that are connected to the even-numbered memory block region can be located at one side and the other side of the column direction with the result that the circuit can be so constituted as not to overlap the circuit regions with each other.

Further, a semiconductor memory device according to the present invention can be characterized in that the memory cell array further comprises an odd-numbered memory block dedicated column decoder arranged at a side of the odd-numbered memory block region in a column direction viewed from a regional border of the odd-numbered memory block region and the even-numbered memory block region and an even-numbered memory block dedicated column decoder arranged at a side of the even-numbered memory block region in a column direction viewed from the regional border.

The column decoder for the odd-numbered memory blocks is disposed on the odd-numbered memory block region side in the column direction with respect to a regional border between the odd-numbered memory block region and the even-numbered memory block region. Also, the column decoder for the even-numbered memory blocks is disposed on the even-numbered memory block region side in the column direction with respect to an extension of the border between the odd-numbered memory block region and the even-numbered memory block region.

As a result, the signal bus length in the column direction of the decode signal bus toward the odd-numbered memory blocks from the column decoder for the odd-numbered memory blocks can be shortened more than when the odd-numbered memory blocks are dispersed over the wide area of the memory cell (in the case where the odd-numbered memory blocks and the even-numbered memory blocks are mixed together). Likewise, the signal bus length in the column direction of the decode signal bus toward the even-numbered memory blocks from the column decoder for the even-numbered memory blocks can be shortened more.

Also, in the case where the even-numbered memory block region and the odd-numbered memory block region divide the column direction of the memory cell array into substantially two, the signal bus length of the decode signal bus along the column direction can be shortened into substantially half. Also, because the decode signal bus that has been connected to the even-numbered memory block region and the odd-numbered memory block region can be divided in each of the regions and connected to each other, the circuit region of the decode signal bus which extends in parallel along the column direction can be divided into substantially half. It is possible to improve the high-speed read due to a reduction in the signal bus length and the degree of freedom of circuitry design due to a reduction in the circuit region required.

Also, it is possible to reduce the drive performance of transistors in the respective circuits due to a reduction of a wiring load which is attributable to a reduction in the wiring length, and an area occupied by the respective circuits can be reduced.

Also, the semiconductor memory device according to the present invention is further characterized in that there is provided a redundant memory block arranged at the regional border of the odd-numbered memory block region and the even-numbered memory block region. With this structure, because the redundant memory block exists in the regional border, the even/odd-numbered memory blocks are disposed in proximity to the redundant memory block, thereby making it possible to reduce a difference between the wiring length of data that is outputted from the redundant memory block and the wiring length of data that is outputted from the respective memory blocks. Accordingly, it is possible to reduce the time required for the data output at the time of redundancy remedy.

Further, a semiconductor memory device according to the present invention may be characterized in that there is provided an odd-numbered memory block selected by odd-numbered column address; an even-numbered memory block selected by even-numbered address; and a memory cell array, wherein, when data read out from the odd-numbered memory block and from the even-numbered memory block is outputted alternately and continuously to conduct a burst operation depending on high-order column addresses obtained by repeating increments of an address which is an inputted initial column address from which lowest-order bit is eliminated, the even-numbered memory block is selected by a +1 high-order column address which is the high-order column address to which "1" is added in case the initial column address is an odd-numbered address, and the semiconductor memory device further includes a redundant memory block for redundancy remedy, a redundant address memory section for storing address of a defective column which exists in at least one of the blocks, namely, one of the odd-numbered memory block and the even-numbered memory block, an odd-numbered-side redundancy judge circuit for judging coincidence of the high-order column address and a high-order defective column address from which the lowest-order bit of the defective column address is eliminated, an address "+1" circuit to which the high-order column address is inputted, the address "+1" circuit outputting the high-order column address in the case where the lowest-order bit of the initial column address is "0", and outputting the +1 high-order column address in the case where the lowest-order bit of the initial column address is "1", and an even-numbered-side redundancy judge circuit for judging coincidence of the address outputted from the address "+1" circuit and the high-order defective column address.

Also, a control method of a semiconductor memory device according to the present invention is characterized in that there is provided an odd-numbered memory block selected by an odd-numbered column address, an even-numbered memory block selected by even-numbered column address, and a redundant memory block for redundancy remedy, and a process whereby when data read out from the odd-numbered memory block and data read out from the even-numbered memory block are outputted alternately and continuously to conduct burst operation depending on high-order column address obtained by repeating increment of address which is an inputted initial column address from which lowest-order bit is eliminated, the even-numbered memory block is selected by a +1 high-order column address which is the high-order column address to which "1" is added in the case where the initial column address is an odd-numbered address, the control method of the semiconductor memory device including an odd-numbered-side redundancy judge step in which coincidence of the high order column address and the high-order defective column address from which the lowest-order bit of the defective column address is eliminated is judged; an "add +1 to address" step in which the high-order column address is outputted in the case where the lowest-order bit of the initial column address is "0", and the +1 high-order column address is outputted in the case where the lowest-order bit of the initial column address is "1"; and an even-numbered-side redundancy judge step in which the coincidence of address signal outputted at the "add +1 to address" step and the high-order defective column address is judged.

The redundant address memory section stores a defective column address of a defective column that exists in at least one of the odd-numbered memory block and the even-numbered memory block. The odd-numbered-side redundancy judge circuit and the odd-numbered-side redundancy judge step judge coincidence of the high-order column address and the high-order defective column address from which the lowest-order bit of the defective column address is eliminated. The address "+1" circuit and the "add +1 to address" step output the high-order column address in the case where the lowest-order bit of the initial column address is "0", and output the +1 high-order column address in the case where the lowest-order bit of the initial column address is "1". The even-numbered-side redundancy judge circuit and the even-numbered-side redundancy judge step judge the coincidence of an address outputted from the address "+1" circuit during the "add +1 to address" step and the high-order defective column address.

With the above structure, "1" is added to the high-order column address from which the lowest-order bit is eliminated. As a result, even in the case where the initial address A0 is "1" (odd), it is possible to conduct the burst operation that enables high-speed read without any time delay with respect to the initial column address.

Further, a semiconductor memory device according to the present invention can be characterized in that there is provided a select section, wherein an output signal from the even-numbered-side redundancy judge circuit and an output signal from the odd-numbered-side redundancy judge circuit are inputted to the select section, and in the case where the lowest-order bit of the defective column address is "0", the select section selects an output signal from the even-numbered-side redundancy judge circuit to output a redundancy judgment result of an even-numbered column address and in the case where the lowest-order bit of the defective column address is "1", the select section selects an output signal from the odd-numbered-side redundancy judge circuit to output a redundancy judgment result of an odd-numbered column address.

The select section or the output select step selects an output signal of the even-numbered-side redundancy judge circuit or the even-numbered-side redundancy judge step in the case where the lowest-order bit of the defective column address is "0", and selects an output signal of the odd-numbered-side redundancy judge circuit or the odd-numbered-side redundancy judge step in the case where the lowest-order bit of the defective column address is "1". The coincidence judge of the high-order column address and the high-order defective column address is conducted by the even-numbered-side redundancy judge circuit and the odd-numbered-side redundancy judge circuit. Also, the coincidence judge of the even-odd of the block from which data is read out and the even and odd of the block that is designated by the lowest-order bit of the defective column address is conducted by the select section.

With the above structure, it is possible to obtain the redundancy judgment result with respect to the odd or even column address that selects the odd-numbered memory block or the even-numbered memory block by judging the above coincidences.

In addition, a semiconductor memory device according to the present invention may be further characterized in that the redundant address memory section comprises an odd-numbered-side redundant address memory section for storing a defective column address existing in the odd-numbered memory block; and an even-numbered-side redundant address memory section for storing a defective column address existing in the even-numbered memory block, and a high-order defective column address stored in the odd-numbered-side redundant address memory section is supplied to the odd-numbered-side redundancy judge circuit and a high-order defective column address stored in the even-numbered-side redundant address memory section is supplied to the even-numbered-side redundancy judge circuit.

The defective column address of the odd-numbered memory block is stored in the odd-numbered-side redundant address memory section, and the defective column address of the even-numbered memory block is stored in the even-numbered-side redundant address memory section, respectively. The defective column address of the odd-numbered memory block and the defective column address of the even-numbered memory block are subjected to the coincidence judge, individually. As a result, in the burst operation of consecutively reading out the even- and odd-numbered column addresses, it is possible to conduct redundancy remedy on the respective consecutive addresses.

Also, the semiconductor memory device according to the present invention may also be characterized in that the redundant memory block includes an odd-numbered redundant memory block for redundancy remedy of the odd-numbered memory block and an even-numbered redundant memory block for redundancy remedy of the even-numbered memory block. With this structure, because a dedicated redundant block is provided in each of the even-numbered memory block and the odd-numbered memory block to allow redundant remedy, redundancy remedy can be conducted even in the case where the defective columns exist in both of the even-numbered memory block and the odd-numbered memory block.

Also, in a semiconductor memory device according to the present invention, there may be provided an odd-numbered-side switch section receiving output data from the odd-numbered memory block and output data from the redundant memory block at least either one of which is not selected; an even-numbered-side switch section receiving output data from the even-numbered memory block and output data from the redundant memory block at least either one of which is not selected; and a common output section constituted by connecting an output terminal of the odd-numbered-side switch section and an output terminal of the even-numbered-side switch section, wherein both output data from the even-numbered memory block and output data from the redundant memory block to be inputted to the even-numbered-side switch section are not selected in cases where the odd-numbered-side switch section selects and outputs data from the odd-numbered memory block or data from the redundant memory block, or both output data from the odd-numbered memory block and output data from the redundant memory block to be inputted to the odd-numbered-side switch section and are not selected in cases where the even-numbered-side switch section selects and outputs data from the even-numbered memory block or data from the redundant memory block.

Further, a control method of the semiconductor memory device in accordance with the present invention may be characterized by an odd-numbered-side select step in which either output data from the odd-numbered memory block or output data from the redundant memory block is selected; and an even-numbered-side select step in which either output data from the even-numbered memory block or output data from the redundant memory block is selected, wherein neither one of output data in the even-numbered-side select step is selected in the case where either output data from the odd-numbered memory block or output data from the redundant memory block is selected and outputted by the odd-numbered-side select step, and wherein neither one of output data in the odd-numbered-side select step is selected in the case where either output data from the even-numbered memory block or output data from the redundant memory block is selected and outputted by the even-numbered-side select step.

In the case where the odd-numbered-side switch section selects and outputs any data from the odd-numbered memory block and the redundant memory block, both of the output data inputted to the even-numbered-side switch section are not selected, and no signal is outputted from the even-numbered-side switch section. Also, in the case where the even-numbered-side switch section selects and outputs any data from the even-numbered memory block and the redundant memory block, both of the output data inputted to the odd-numbered-side switch section is non-selected, and no signal is outputted from the odd-numbered-side switch section.

Similarly, in the case where the odd-numbered-side select step selects and outputs any data from the odd-numbered memory block and the redundant memory block, both of the output data are not selected, and no signal is outputted in the even-numbered-side select step. Also, in the case where the even-numbered-side select step selects and outputs any data from the even-numbered memory block and the redundant memory block, both of the output data are not selected, and no signal is outputted in the odd-numbered-side select step.

In this situation, the common output section so-called wired-OR connects the respective output terminals of the odd-numbered-side switch section and the even-numbered-side switch section.

With the above structure, even if a circuit or step that alternately selects and outputs the output data is not additionally provided in the odd-numbered-side switch section or the odd-numbered-side select step and in the even-numbered-side switch section or the even-numbered-side select step, it is possible to conduct the burst operation that alternately consecutively outputs the data read from the odd-numbered memory block and the data read from the even-numbered memory block.

Further, a semiconductor memory device according to the present invention may also be characterized in that there is provided an odd-numbered column select section for selecting a column directed to to-be-inputted as an odd-numbered column address among columns in the odd-numbered memory blocks; an even-numbered column select section for selecting a column directed to to-be-inputted as an even-numbered column address among columns in the even-numbered memory blocks; and a redundant column select section for selecting a column directed to the defective column address among columns in the redundancy memory block, wherein an output terminal of the redundant column select section is connected to at least either one of the output terminals, namely, the output terminal of the odd-numbered column select section and the output terminal of the even-numbered column select section, and the redundant column select section does not select a column in the case where the redundancy remedy is not made, and whereas at least either the odd-numbered column select section or the even-numbered column select section does not select a column in the case where redundancy remedy is made.

Further, a control method of a semiconductor memory device in accordance with the present invention may also provide an odd-numbered column select step in which a column directed to an odd-numbered column address is selected from among columns in the odd-numbered memory block; an even-numbered column select step in which a column directed to an even-numbered column address is selected from among columns in the even-numbered memory block; and a redundant column select step in which a column directed to the defective column address selected from among columns in the redundant memory block, wherein a column is not selected in the redundant column select step in the case where a redundancy remedy is not made, and wherein a column is not selected in at least one of two steps, namely, the odd-numbered column select step and the even-numbered column select step, in the case where the redundancy remedy is made.

In the case where no redundancy remedy is conducted, because the column is not selected in the redundant column select section, no data is outputted from the redundant column select section. In this situation, because at least one of the output terminals of the odd-numbered column select section and the even-numbered column select section is connected to the output terminal of the redundant column section, data from at least one of the odd-numbered column select section and the even-numbered column select section is selectively outputted.

Also, in the case where the redundancy remedy is conducted, because the column is not selected in at least one of the odd-numbered column select section and the even-numbered column select section, no data is outputted from the column select section that does not select the column. Accordingly, the output data of the redundant column select section is outputted.

Likewise, in a method of controlling the semiconductor memory device in accordance with the present invention, in the case where no redundancy remedy is conducted, no data is outputted by not selecting the column in the redundant column select step, and data of the column selected in at least one of the odd-numbered column select step and the even-numbered column select step is outputted. Also, in the case where the redundancy remedy is conducted, no data is outputted by not selecting the column in at least one of the odd-numbered column select step and the even-numbered column select step, and data of the column selected in the redundant column select step is outputted.

With the above structure, it is possible to conduct redundancy remedy by switching the output data in combination with the presence or absence of the column select by the redundant column select section and at least one of the even-numbered column select section and the even-numbered column select section. As a result, it is unnecessary to additionally provide a circuit that selects the changeover of the output data, thereby making it possible to reduce the chip area and reduce the costs of the semiconductor memory device.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

INDUSTRIAL APPLICABILITY

As was described above, according to the semiconductor memory device and the method of manufacturing the semiconductor memory device of the present invention, there can be provided the semiconductor memory device and the method of controlling the semiconductor memory device, which can conduct redundancy remedy and can prevent the read operation speed from becoming slow even in a semiconductor memory device that conducts the burst read operation, and which can also reduce the circuit area.

What is claimed is:

1. A semiconductor memory device comprising;
an odd-numbered memory block selected by an odd-numbered column address;
an even-numbered memo block selected by an even-numbered column address;
a redundant memory block arranged at the regional border of the odd-numbered memory block region and the even-numbered memory block region; and
a memory cell array, wherein, when data read out from the odd-numbered memory block and from the even-numbered memory block are outputted alternately and continuously to conduct a burst operation depending on a high-order column address obtained by repeatedly incrementing an address which is an inputted initial column address from which a lowest-order bit is eliminated, the even-numbered memory block is selected by a +1 high-order column address which is the high-order column address to which "1" is added in case the initial column address is an odd-numbered address, and wherein the memory cell array comprises:
an odd-numbered memory block region consisting of the odd-numbered memory block arranged on one side in a column direction for the memory cell array; and
an even-numbered memory block region consisting of the even-numbered memory block arranged on another side in a column direction for the memory cell array.

2. A semiconductor memory device comprising:
an odd-numbered memory block selected by an odd-numbered column address;

an even-numbered memory block selected by an even-numbered address; and a memory cell array, wherein, when data read out from the odd-numbered memory block and from the even-numbered memory block is outputted alternately and continuously to conduct a burst operation depending on a high-order column address obtained by repeatedly increment an address which is an inputted initial column address from which a lowest-order bit is eliminated, the even-numbered memory block is selected by a +1 high-order column address which is the high-order column address to which "1" is added in case the initial column address is an odd-numbered address, and wherein the semiconductor memory device further comprises:

a redundant memory block for redundancy remedy;

a redundant address memory section for storing an address of a defective column which exists in at least one block, namely, the odd-numbered memory block and the even-numbered memory block;

an odd-numbered-side redundancy judge circuit for judging coincidence of the high-order column address and a high-order defective column address from which a lowest-order bit of the defective column address is eliminated;

an address "+1" circuit to which the high-order column address is inputted, the address "+1" circuit outputting the high-order column address in the case where a lowest-order bit of the initial column address is "0", and outputting the +1 high-order column address in the case where a lowest-order bit of the initial column address is "1"; and an even-numbered-side redundancy judge circuit for judging coincidence of addresses outputted from the address "+1" circuit and the high-order defective column address.

3. A semiconductor memory device according to claim 2 further comprising a. select section, wherein an output signal from the even-numbered-side redundancy judge circuit and an output signal from the odd-numbered-side redundancy judge circuit are inputted to the select section, and in the case where a lowest-order bit of the defective column address is "0", the select section selects an output signal from the even-numbered-side redundancy judge circuit to output a redundancy judgment result of an even-numbered column address and in the case where the lowest-order bit of the defective coiumn address is "1", the select section selects an output signal from the odd-numbered-side redundancy judge circuit to output a redundancy judgment result of an odd-numbered column address.

4. A semiconductor memory device according to claim 2, wherein the redundant address memory section comprises:

an odd-numbered-side redundant address memory section for storing a defective column address existing in the odd-numbered memory block; and an even-numbered-side redundant address memory section for storing a defective column address existing in the even-numbered memory block, and wherein a high-order defective column address stored in the odd-numbered-side redundant address memory section is supplied to the odd-numbered-side redundancy judge circuit and a high-order defective column address stored in the even-numbered-side redundant address memory section is supplied to the even-numbered-side redundancy judge circuit.

5. A semiconductor memory device according to claim 4, wherein the redundant memory block comprises an odd-numbered redundant memory block for redundancy remedy of the odd-numbered memory block and an even-numbered redundant memory block for redundancy remedy of the even-numbered memory block.

6. A semiconductor memory device according to claim 2 further comprising:

an odd-numbered-side switch section receiving output data from the odd-numbered memory block and output data from the redundant memory block at least either one of which is not selected;

an even-numbered-side switch section receiving output data from the even-numbered memory block and output data from the redundant memory block at least either one of which is not selected; and a common output section constituted by connecting an output terminal of the odd-numbered-side switch section and an output terminal of the even-numbered-side switch section, wherein both output data from the even-numbered memory block and output data from the redundant memory block to be inputted to the even-numbered-side switch section are not selected in the case where the odd-numbered-side switch section selects and outputs data from the odd-numbered memory block or data from the redundant memory block, or both output data from the odd-numbered memory block and output data from the redundant memory block to be inputted to the odd-numbered-side switch section are not selected in the case where the even-numbered-side switch section selects and outputs data from the even-numbered memory block or data from the redundant memory block.

7. A semiconductor device according to claim 2 further comprising:

an odd-numbered column select section for selecting a column directed to a to-be-inputted odd-numbered column address among columns in the odd-numbered memory blocks;

an even-numbered column select section for selecting a column directed to a to-be-inputted even-numbered column address among columns in the even-numbered memory blocks; and a redundant column select section for selecting a column directed to the defective column address among columns in the redundancy memory block, wherein an output terminal of the redundant column select section is connected to at least either output terminal, namely, the output tenninal of the odd-numbered column select section and the output terminal of the even-numbered column select section, and the redundant column select section does not select a column in the case where redundancy remedy is not made, and whereas at least either the odd-numbered column select section or the even-numbered column select section does not select a column in the case where redundancy remedy is made.

8. A control method of a semiconductor memory device which comprises an odd-numbered memory block selected by an odd-numbered column address, an even-numbered memory block selected by an even-numbered column address, and a redundant memory block for redundancy remedy, wherein the semiconductor memory device operates such that when data read out from the odd-numbered memory block and data read out from the even-numbered memory block are outputted alternately and continuously to conduct a burst operation depending on a high-order column address obtained by repeatedly incrementing an address which is an inputted initial column address from which a lowest-order bit is eliminated, the even-numbered memory block is selected by a +1 high-order column address which is the high-order column address to which "1" is added in case the initial column address is an odd-numbered address, the control method of the semiconductor memory device comprising:

an odd-numbered-side redundancy judge step in which coincidence of the high order column address and a high-order defective column address from which a lowest-order bit of the defective column address is eliminated is judged;

an "add +1 to address" step in which the high-order column address is outputted in the case where a lowest-order bit pf the initial column address is "0", and a +1 high-order column address is outputted in the case where the lowest-order bit of the initial column address is "1"; and an even-numbered-side redundancy judge step in which coincidence of the address outputted at the "add +1 to address" step and the high-order defective column address is judged.

9. The control method of a semiconductor memory device according to claim 8 further comprising an output select step wherein the even-numbered-side redundancy judge step is selected to output a redundancy judgment result of an even-numbered column address including the high-order column address in the case where the lowest-order bit of the defective column address is "0", and the odd-numbered-side redundancy judge step is selected to output a redundancy judgment result of an odd-numbered column address including the high-order column address in the case where the lowest-order bit of the defective column address is "1".

10. The control method of a semiconductor memory device according to claim 8 further comprising:

an odd-numbered-side select step in which either output data from the odd-numbered memory block or output data from the redundant memory block is selected; and an even-numbered-side select step in which either output data from the even-numbered memory block or output data from the redundant memory block is selected, wherein neither one of the output data in the even-numbered-side select step is selected in the case where either output data from the odd-numbered memory block or output data from the redundant memory block is selected and outputted by the odd-numbered-side select step, and neither one of the output data in the odd-numbered-side select step is selected in the case where either output data from the even-numbered memory block or output data from the redundant memory block is selected and outputted by the even-numbered-side select step.

11. The control method of a semiconductor memory device according to claim 8 further comprising:

an odd-numbered column select step in which a column directed to an odd-numbered column address is selected from among columns in the odd-numbered memory block;

an even-numbered column select step in which a column directed to an even-numbered column address is selected from among columns in the even-numbered memory block; and a redundant column select step in which a column directed to the defective column address is selected from among columns in the redundant memory block, wherein a column is not selected in the redundant column select step in the case where the redundancy remedy is not made, and wherein a column is also not selected in at least one of two steps, namely, the odd-numbered column select step and the even-numbered column select step, in the case where the redundancy remedy is made.

* * * * *